US012670844B2

(12) United States Patent
Liao et al.

(10) Patent No.: US 12,670,844 B2
(45) Date of Patent: Jun. 30, 2026

(54) ELECTRONIC DEVICE

(71) Applicant: Huawei Technologies Co., Ltd., Shenzhen (CN)

(72) Inventors: Zhihua Liao, Xi'an (CN); Yamin Zhou, Dongguan (CN); Defu Shi, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 315 days.

(21) Appl. No.: 18/557,007

(22) PCT Filed: Mar. 28, 2022

(86) PCT No.: PCT/CN2022/083440
§ 371 (c)(1),
(2) Date: Oct. 24, 2023

(87) PCT Pub. No.: WO2022/227981
PCT Pub. Date: Nov. 3, 2022

(65) Prior Publication Data
US 2024/0212587 A1      Jun. 27, 2024

(30) Foreign Application Priority Data

Apr. 25, 2021      (CN) .......................... 202110449800.1

(51) Int. Cl.
G09G 3/32       (2016.01)
H05K 7/20       (2006.01)
H05K 9/00       (2006.01)
(52) U.S. Cl.
CPC ............. G09G 3/32 (2013.01); H05K 7/2039 (2013.01); H05K 9/0024 (2013.01); G09G 2320/0626 (2013.01); G09G 2330/021 (2013.01)

(58) Field of Classification Search
CPC ............. G09G 3/32; G09G 2320/0626; G09G 2330/021; G09G 2300/0426;
(Continued)

(56) References Cited

U.S. PATENT DOCUMENTS 4,673,612 A      6/1987   Takagi et al.
2010/0259928 A1   10/2010   Ou Yang et al.
(Continued)

FOREIGN PATENT DOCUMENTS

CN       106876562 A      6/2017
CN       108732822 A   *   11/2018   ....... G02F 1/133603
(Continued)

*Primary Examiner* — Matthew A Eason
*Assistant Examiner* — Chayce R Bibbee
(74) *Attorney, Agent, or Firm* — Slater Matsil, LLP

(57) ABSTRACT

This application provides an electronic device, including a backplane, a flat panel, a mini-LED lighting panel, and a diffusion panel. The flat panel is located between the backplane and the mini-LED lighting panel, a light mixing space is formed between the mini-LED lighting panel and the diffusion panel, and light emitted by the mini-LED lighting panel is incident on the diffusion panel through the light mixing space. The mini-LED lighting panel includes a plurality of sub-mini-LED lighting panels, and each sub-mini-LED lighting panel includes a connector. The sub-mini-LED lighting panel may be directly electrically connected to a drive module of the electronic device, or may be indirectly electrically connected to a drive module of the electronic device through another sub-mini-LED lighting panel.

20 Claims, 12 Drawing Sheets

(58) Field of Classification Search
CPC ................ H05K 7/2039; H05K 9/0024; G02F
1/133628; G02F 1/133612; G02F
1/133603; G09F 9/33
See application file for complete search history.

(56) References Cited

U.S. PATENT DOCUMENTS

| | | | |
|---|---|---|---|
| 2012/0113328 A1 | 5/2012 | Takeshima et al. | |
| 2016/0224306 A1* | 8/2016 | Rycyna, III | G09G 3/32 |
| 2019/0346113 A1* | 11/2019 | Zhang | G02F 1/133621 |
| 2021/0005585 A1 | 1/2021 | Wu | |
| 2021/0091282 A1 | 3/2021 | Li et al. | |

FOREIGN PATENT DOCUMENTS

| | | | | |
|---|---|---|---|---|
| CN | 110133907 A | 8/2019 | | |
| CN | 209215812 U | 8/2019 | | |
| CN | 110794616 A | 2/2020 | | |
| CN | 111025755 A | 4/2020 | | |
| CN | 210864267 U | 6/2020 | | |
| CN | 111429817 A | 7/2020 | | |
| CN | 210982988 U | 7/2020 | | |
| CN | 211979375 U | 11/2020 | | |
| JP | 2016024334 A | 2/2016 | | |
| JP | 7283679 B2 | 5/2023 | | |
| KR | 20100033726 A | 3/2010 | | |
| KR | 20110041967 A | 4/2011 | | |
| KR | 20170013696 A * | 2/2017 | ....... | G02F 1/133602 |
| KR | 20190053312 A | 5/2019 | | |
| WO | WO-2013120280 A1 * | 8/2013 | .......... | G02F 1/1336 |

* cited by examiner

200

200

2300

Light emitting region A     Light emitting region B

2301

260     261     231

200

210

210

281
287
282

220

286

225  226

ELECTRONIC DEVICE

CROSS-REFERENCE TO RELATED APPLICATIONS

This application is a National Stage of International Patent Application No. PCT/CN2022/083440 filed on Mar. 28, 2022, which claims priority to Chinese Patent Application No. 202110449800.1 filed on Apr. 25, 2021. The disclosures of the aforementioned applications are hereby incorporated by reference in their entireties.

TECHNICAL FIELD

This application relates to the field of electronic devices, and more specifically, to an electronic device.

BACKGROUND

Current electronic devices (for example, large-screen devices) develop toward lightness and thinness. The electronic device may include a mini-light-emitting diode (mini-light-emitting diode, mini-LED) lighting panel. A mini-LED technology can reduce an optical distance, and can further reduce an entire thickness of the electronic device. The mini-LED lighting panel may include thousands of light emitting units. Introducing the mini-LED lighting panel into the electronic device may cause problems such as redundant cabling and complex light emitting driving.

SUMMARY

This application provides a new electronic device. The electronic device may be featured with lightness and thinness. Cabling in the electronic device may be relatively simple. The solution in this application is beneficial for the electronic device to flexibly drive a light emitting unit on a mini-LED lighting panel.

According to a first aspect, an electronic device is provided. The electronic device includes a backplane, a flat panel, a mini-light-emitting diode mini-LED lighting panel, and a diffusion panel. The flat panel is located between the backplane and the mini-LED lighting panel. The mini-LED lighting panel is located between the flat panel and the diffusion panel. A light mixing space is formed between the mini-LED lighting panel and the diffusion panel. Light emitted by the mini-LED lighting panel is incident on the diffusion panel through the light mixing space. The electronic device further includes a first electrical connecting member and a second electrical connecting member, and a drive module.

The drive module includes a first power port.

The mini-LED lighting panel includes a first mini-LED lighting panel group. The first mini-LED lighting panel group includes a first sub-mini-LED lighting panel and a second sub-mini-LED lighting panel. The first sub-mini-LED lighting panel includes a first connector and a second connector. The first connector is electrically connected to the first power port through a first electrical connecting member. The second sub-mini-LED lighting panel includes a third connector. The third connector is electrically connected to the second connector through a second electrical connecting member.

In this application, a light mixing distance of the mini-LED lighting panel may be reduced to, for example, within 1 mm, or even to a smaller light mixing distance. In a narrow light mixing space, the drive module is electrically connected to the first sub-mini-LED lighting panel, and the first sub-mini-LED lighting panel may be electrically connected to the second sub-mini-LED lighting panel, so that one power port of the drive module may correspond to at least two sub-mini-LED lighting panels. This can reduce a quantity of power ports of the drive module.

Two adjacent sub-mini-LED lighting panels may be electrically connected, so that a second mini-LED lighting panel far away from the drive module may obtain an electrical signal of the drive module through the first sub-mini-LED lighting panel close to the drive module. This can reduce a cabling length between the second sub-mini-LED lighting panel and the drive module, and can further reduce cabling complexity in the electronic device.

With reference to the first aspect, in some implementations of the first aspect, the first sub-mini-LED lighting panel or the second sub-mini-LED lighting panel further includes a fourth connector, and the electronic device further includes a third electrical connecting member.

The first mini-LED lighting panel group further includes a third sub-mini-LED lighting panel. The third sub-mini-LED lighting panel includes a fifth connector. The fifth connector is electrically connected to the fourth connector through the third electrical connecting member.

In this application, a plurality of sub-mini-LED lighting panels may be connected in series or in parallel to each other. This can reduce a quantity of sub-mini-LED lighting panels that are directly connected to the drive module, and can further reduce a quantity of ports of the drive module, and facilitate arrangement and cabling, and the like.

With reference to the first aspect, in some implementations of the first aspect, the electronic device further includes a second mini-LED lighting panel group and a fourth electrical connecting member, and the drive module further includes a second power port.

The second mini-LED lighting panel group is electrically connected to the second power port through the fourth electrical connecting member. The first power port is different from the second power port.

In this application, one power port may correspond to one mini-LED lighting panel group, to correspondingly control a group of sub-mini-LED lighting panels. This can implement group control of a plurality of sub-mini-LED lighting panels.

With reference to the first aspect, in some implementations of the first aspect, the backplane includes an electrical connecting member accommodating groove. The electrical connecting member accommodating groove is provided corresponding to the second electrical connecting member. The electrical connecting member accommodating groove is recessed in a direction away from the mini-LED lighting panel. The second electrical connecting member is accommodated in the electrical connecting member accommodating groove.

In this application, most regions of the second electrical connecting member are located between the flat panel and the backplane. The electrical connecting member accommodating groove for accommodating the second electrical connecting member is provided on the backplane, so that the second electrical connecting member does not decrease flatness of the flat panel as much as possible.

With reference to the first aspect, in some implementations of the first aspect, the drive module is disposed on a side of the backplane away from the first sub-mini-LED lighting panel. The backplane includes a first backplane through hole provided corresponding to the first connector.

The first electrical connecting member or the first connector passes through the first backplane through hole.

In this application, the drive module is disposed on the side of the backplane away from the mini-LED lighting panel, so that when the backplane, the flat panel, and the first sub-mini-LED lighting panel are mounted, an assembly person or a robotic arm may implement an electrical connection between the first electrical connecting member and the first connector through a backplane through hole corresponding to the first connector.

With reference to the first aspect, in some implementations of the first aspect, the drive module located at a side of the flat panel away from the first sub-mini-LED lighting panel. The flat panel includes a first flat panel through hole provided corresponding to the first connector. The first connector passes through the first flat panel through hole.

In this application, the drive module is disposed on the side of the backplane away from the mini-LED lighting panel, so that when the backplane, the flat panel, and the first sub-mini-LED lighting panel are mounted, an assembly person or a robotic arm may implement an electrical connection between the first electrical connecting member and the first connector through a flat panel through hole corresponding to the first connector.

With reference to the first aspect, in some implementations of the first aspect, the first sub-mini-LED lighting panel includes:

a light emitting unit group, where the light emitting unit group includes m first light emitting units, and m is an integer greater than or equal to 1; and a drive unit, where the drive unit is electrically connected to the first connector. The drive unit includes a public electrical signal port and a drive port corresponding to the light emitting unit group. One end of each first light emitting unit in the light emitting unit group is electrically connected to the public electrical signal port, and the other end of each first light emitting unit in the light emitting unit group is electrically connected to the drive port.

In this application, a drive circuit for separately controlling a light emitting unit group is provided. This is beneficial for the electronic device to separately control a single light emitting unit group, so that the mini-LED lighting panel can be divided into a plurality of display zones, for example, thousands of display zones, thereby improving driving and control flexibility of the mini-LED lighting panel.

With reference to the first aspect, in some implementations of the first aspect, the flat panel includes a second flat panel through hole. The second flat panel through hole is provided corresponding to the drive unit. The drive unit passes through the second flat panel through hole.

In this application, the drive unit passes through the through hole on the flat panel, so that a protrusion on a rear view of the first sub-mini-LED lighting panel does not affect flatness support of the flat panel for the first sub-mini-LED lighting panel.

With reference to the first aspect, in some implementations of the first aspect, the backplane includes a drive unit accommodating groove. The drive unit accommodating groove is provided corresponding to the drive unit. The drive unit accommodating groove is recessed in a direction away from the first sub-mini-LED lighting panel. The drive unit is accommodated in the drive unit accommodating groove.

In this application, the drive unit accommodating groove may be configured to avoid the drive unit of the mini-LED lighting panel, and reduce a risk of collision between the backplane and the drive unit. In addition, a bottom and a side wall of the drive unit accommodating groove may block and cover the drive unit. This can mechanically protect the drive unit. The drive unit may be relatively sensitive to electromagnetic signal interference. The drive unit accommodating groove may further provide an electromagnetic shielding function for the drive unit, to reduce an electromagnetic compatibility (electromagnetic compatibility, EMC) risk for the drive unit.

With reference to the first aspect, in some implementations of the first aspect, the first light emitting unit is disposed on a first lighting panel end face of the first sub-mini-LED lighting panel. The drive unit disposed on a second lighting panel end face of the first sub-mini-LED lighting panel. The first sub-mini-LED lighting panel further includes:

a heat conducting block, where the heat conducting block is disposed on the drive unit; and a shielding can, where the drive unit is located in a shielding space of the shielding can, and the shielding can is in contact with the heat conducting block.

In this application, the shielding can is pasted on the heat conducting block, so that a shielding function of the drive unit can be implemented, EMC performance of the drive unit can be improved, and heat of the heat conducting block can be further transferred. Heat generated by the drive unit may be transmitted to a plurality of components. This can reduce an overheating risk of the drive unit.

With reference to the first aspect, in some implementations of the first aspect, the first sub-mini-LED lighting panel further includes:

a heat conducting film, where a part of the heat conducting film is pasted on the shielding can, and the other part of the heat conducting film is pasted on the second lighting panel end face.

In this application, the drive unit may generate heat during working, that is, may have a heat dissipation problem. Transferring the heat generated by the drive unit as far as possible through the heat conducting film can improve a heat dissipation effect of the drive unit.

With reference to the first aspect, in some implementations of the first aspect, the heat conducting film includes a first part, a second part, and a third part. The first part is pasted on a top surface of the shielding can, the second part is pasted on the second lighting panel end face, the third part is connected between the first part and the second part, and the third part is pasted on a side surface of the shielding can.

In this application, the heat conducting film may have specific softness. If the heat conducting film can wrap all sides of a shielding frame, the heat conducting film may be wrinkled. Wrapping only a part of a side surface of the shielding frame by the heat conducting film can reduce a possibility that the heat conducting film is wrinkled, and improve bonding performance between the heat conducting film and the shielding can and bonding performance between the heat conducting film and the second lighting panel end face.

With reference to the first aspect, in some implementations of the first aspect, the electronic device further includes an optically transparent spacer, the optically transparent spacer is located between the mini-LED lighting panel and the diffusion panel, and the optically transparent spacer is pasted on a surface of the mini-LED lighting panel.

In this application, the optically transparent spacer may be for controlling a spacing between the mini-LED lighting panel and the diffusion panel. Disposing the optically transparent spacer on the surface of the mini-LED lighting panel can prevent drilling holes on the surface of the mini-LED lighting panel, so that the optically transparent spacer does not affect the arrangement of the light emitting units on the mini-LED lighting panel, thereby improving display uniformity of the mini-LED lighting panel.

With reference to the first aspect, in some implementations of the first aspect, the optically transparent spacer has a curved surface, and the curved surface is provided on a side of the optically transparent spacer close to the diffusion panel.

In this application, the diffusion panel may not be fixedly connected to the optically transparent spacer. In a process of transporting an electronic device, the diffusion panel may collide with the optically transparent spacer. A structure of the optically transparent spacer has a curved surface, and the optically transparent spacer has a small quantity of corners and straight edges. This can reduce a collision damage of the optically transparent spacer to the diffusion panel.

Optionally, a thickness of the optically transparent spacer is the same as the light mixing distance.

In this application, providing a single optically transparent spacer can accurately control the light mixing distance of the mini-LED lighting panel. In another example, providing a plurality of optically transparent spacers in a light mixing direction can flexibly control the light mixing distance of the mini-LED lighting panel. For example, a thickness of an optically transparent spacer located in a central region of the mini-LED lighting panel may be different from a thickness of an optically transparent spacer located in an edge region of the mini-LED lighting panel.

With reference to the first aspect, in some implementations of the first aspect, the optically transparent spacer covers a light emitting unit of the mini-LED lighting panel.

In this application, the optically transparent spacer is disposed on the light emitting unit of the mini-LED lighting panel, so that an arrangement manner of the light emitting unit in the region in which the optically transparent spacer is located may be basically not affected.

With reference to the first aspect, in some implementations of the first aspect, the electronic device further includes:

a diffusion panel support, where a side of the diffusion panel support is in contact with the diffusion panel, and a side surface of the diffusion panel support close to the mini-LED lighting panel is arranged at a spacing with a side surface of the mini-LED lighting panel.

In this application, the diffusion panel support is provided, so that when a size, a location, or the like of the diffusion panel changes, light mixing processing borne by light emitted from the edge region of the mini-LED lighting panel may be approximately the same or basically unchanged, thereby preventing a user from sensing any light mixing effect difference.

The diffusion panel may resist a plurality of thermal cycles of thermal expansion and cold contraction. If the expansion and contraction of the diffusion panel is relatively obvious, the diffusion panel may be at least partially detached from the diffusion panel support, affecting the light mixing effect. The diffusion panel support and the mini-LED lighting panel are disposed at a spacing, so that reflection of light on an inner wall of the diffusion panel support is reduced, with a compromising impact of the diffusion panel support on light emitted from the edge region of the mini-LED lighting panel.

With reference to the first aspect, in some implementations of the first aspect, the diffusion panel support further includes a support boss, and the support boss extends from a body of the diffusion panel support to the mini-LED lighting panel group.

The support boss may help to increase a contact area between the diffusion panel support and the diffusion panel. Providing the support boss on the diffusion panel support can reduce a possibility that the diffusion panel is detached from the diffusion panel support, and can further enable the diffusion panel to have a relatively small size, thereby improving a screen ratio, lightness and thinness performance, and the like of the electronic device.

According to a second aspect, an electronic device is provided. The electronic device includes a backplane, a flat panel, at least one mini-light-emitting diode mini-LED lighting panel, and a diffusion panel. The flat panel is located between the backplane and the mini-LED lighting panel. The mini-LED lighting panel is located between the flat panel and the diffusion panel. A light mixing space is formed between the mini-LED lighting panel and the diffusion panel. Light emitted by the mini-LED lighting panel is incident on the diffusion panel through the light mixing space.

The electronic device further includes an optically transparent spacer, the optically transparent spacer is located between the mini-LED lighting panel and the diffusion panel, and the optically transparent spacer is pasted on a surface of the mini-LED lighting panel.

In this application, the optically transparent spacer may be for controlling a spacing between the mini-LED lighting panel and the diffusion panel. Disposing the optically transparent spacer on the surface of the mini-LED lighting panel can prevent drilling holes on the surface of the mini-LED lighting panel, so that the optically transparent spacer does not affect the arrangement of the light emitting units on the mini-LED lighting panel, thereby improving display uniformity of the mini-LED lighting panel.

A round corner is provided on a side of the optically transparent spacer close to the diffusion panel, and the optically transparent spacer has a small quantity of corners and straight edges. This can reduce collisions between the optically transparent spacer and the diffusion panel. The diffusion panel may resist thermal expansion and cold contraction, so the diffusion panel may not be fixedly connected to the optically transparent spacer. In a process of transporting an electronic device, the diffusion panel may collide with the optically transparent spacer. A structure of the optically transparent spacer has a round corner, and the optically transparent spacer has a small quantity of corners and straight edges. This can reduce a collision damage of the optically transparent spacer to the diffusion panel.

With reference to the second aspect, in some implementations of the second aspect, the optically transparent spacer has a curved surface, and the curved surface is provided on a side of the optically transparent spacer close to the diffusion panel.

In this application, the diffusion panel may not be fixedly connected to the optically transparent spacer. In a process of transporting an electronic device, the diffusion panel may collide with the optically transparent spacer. A structure of the optically transparent spacer has a curved surface, and the optically transparent spacer has a small quantity of corners and straight edges. This can reduce a collision damage of the optically transparent spacer to the diffusion panel.

Optionally, a thickness of the optically transparent spacer is the same as the light mixing distance.

In this application, providing a single optically transparent spacer can accurately control the light mixing distance of the mini-LED lighting panel. In another example, providing a plurality of optically transparent spacers in a light mixing direction can flexibly control the light mixing distance of the mini-LED lighting panel. For example, a thickness of an optically transparent spacer located in a central region of the mini-LED lighting panel may be different from a thickness of an optically transparent spacer located in an edge region of the mini-LED lighting panel.

With reference to the second aspect, in some implementations of the second aspect, the optically transparent spacer covers a light emitting unit of the mini-LED lighting panel.

In this application, the optically transparent spacer is disposed on the light emitting unit of the mini-LED lighting panel, so that an arrangement manner of the light emitting unit in the region in which the optically transparent spacer is located may be basically not affected.

According to a third aspect, a method for controlling a light emitting unit is provided. The method is applied to an electronic device, the electronic device includes a mini-LED lighting panel, and the mini-LED lighting panel includes:

a light emitting unit group, where the light emitting unit group includes m light emitting units, and m is an integer greater than or equal to 1; and a drive unit, where the drive unit includes a public electrical signal port and a drive port corresponding to the light emitting unit group. One end of each first light emitting unit in the light emitting unit group is electrically connected to the public electrical signal port, and the other end of each first light emitting unit in the light emitting unit group is electrically connected to the drive port.

The method includes:

controlling a brightness state of each light emitting unit in the light emitting unit group by controlling a voltage difference between the public electrical signal port and the drive port.

In this application, a drive circuit for separately controlling a light emitting unit group and a control method for the drive circuit are provided. The drive circuit and the control method are beneficial for the electronic device to separately control a single light emitting unit group, so that the mini-LED lighting panel can be divided into a plurality of display zones, for example, thousands of display zones, thereby improving driving and control flexibility of the mini-LED lighting panel.

In an example, the m light emitting units are connected in series. The controlling a brightness state of each light emitting unit in the light emitting unit group by controlling a voltage difference between the public electrical signal port and the drive port includes:

turning on each light emitting unit in the light emitting unit group by controlling the voltage difference to be higher than a first preset voltage. The first preset voltage is equal to or higher than m×V1, and V1 is a working voltage of the light emitting unit.

In an example, the m light emitting units are connected in series. The controlling a brightness state of each light emitting unit in the light emitting unit group by controlling a voltage difference between the public electrical signal port and the drive port includes:

turning off each light emitting unit in the light emitting unit group by controlling the voltage difference to be higher than a second preset voltage. The second preset voltage is equal to or lower than m×V1, and V1 is a working voltage of the light emitting unit.

In an example, the m light emitting units are connected in series. The controlling a brightness state of each light emitting unit in the light emitting unit group by controlling a voltage difference between the public electrical signal port and the drive port includes:

increasing a load voltage of each light emitting unit in the light emitting unit group by V2 by increasing a voltage difference by m×V2.

In an example, the m light emitting units are connected in series. The controlling a brightness state of each light emitting unit in the light emitting unit group by controlling a voltage difference between the public electrical signal port and the drive port includes:

decreasing a load voltage of each light emitting unit in the light emitting unit group by V3 by decreasing a voltage difference by m×V3.

In an example, the m light emitting units are connected in parallel. The controlling a brightness state of each light emitting unit in the light emitting unit group by controlling a voltage difference between the public electrical signal port and the drive port includes:

turning on each light emitting unit in the light emitting unit group by controlling the voltage difference to be higher than a first preset voltage. The first preset voltage is equal to or higher than V1, and V1 is a working voltage of the light emitting unit.

In an example, the m light emitting units are connected in parallel. The controlling a brightness state of each light emitting unit in the light emitting unit group by controlling a voltage difference between the public electrical signal port and the drive port includes:

turning off each light emitting unit in the light emitting unit group by controlling the voltage difference to be higher than a second preset voltage. The second preset voltage is equal to or lower than V1, and V1 is a working voltage of the light emitting unit.

In an example, the m light emitting units are connected in parallel. The controlling a brightness state of each light emitting unit in the light emitting unit group by controlling a voltage difference between the public electrical signal port and the drive port includes:

increasing a load voltage of each light emitting unit in the light emitting unit group by V2 by increasing the voltage difference by V2.

In an example, the m light emitting units are connected in parallel. The controlling a brightness state of each light emitting unit in the light emitting unit group by controlling a voltage difference between the public electrical signal port and the drive port includes:

decreasing a load voltage of each light emitting unit in the light emitting unit group by V3 by decreasing the voltage difference by V3.

With reference to the third aspect, in some implementation of the third aspect, before the controlling a brightness state of each light emitting unit in the light emitting unit group, the method further includes:

determining an image block that is of an image and that is corresponding to the light emitting unit group, where the image block includes at least one pixel.

The controlling a brightness state of each light emitting unit in the light emitting unit group includes:

controlling a brightness state of each light emitting unit in the light emitting unit group based on a pixel value of the at least one pixel.

In this application, because the mini-LED lighting panel may be divided into a plurality of light emitting unit groups, a target image is divided based on the plurality of light emitting unit groups of the mini-LED lighting panel, so that the light emitting unit group of the mini-LED lighting panel may be associated with an image block of the target image, thereby facilitating control of the mini-LED lighting panel to be more suitable for a style, a scenario, and the like of the target image.

With reference to the third aspect, in some implementations of the third aspect, the controlling a brightness state of each light emitting unit in the light emitting unit group based on a pixel value of the at least one pixel includes:

turning off each light emitting unit in the light emitting unit group when the pixel value of the at least one pixel is corresponding to black.

In this application, when a black image block of a specific area appears on the target image, a corresponding light emitting unit may be turned off. This can reduce energy consumption of the mini-LED lighting panel.

DETAILED DESCRIPTION OF ILLUSTRATIVE EMBODIMENTS

The following describes technical solutions of this application with reference to accompanying drawings.

Figure 1:
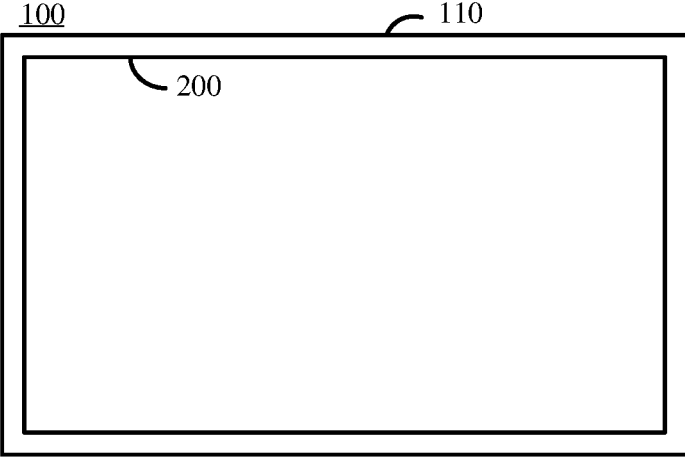
FIG. 1 is a schematic diagram of a structure of an electronic device according to an embodiment of this application.

FIG. 1 is a schematic diagram of a structure of an electronic device according to an embodiment of this application.

The electronic device 100 may be a large-screen electronic device such as a display screen, a television (such as a smart screen), a laptop, a tablet, a vehicle-mounted device, or the like. Optionally, in some scenarios, the electronic device 100 may be a device such as a mobile phone, an e-reader, or a wearable device. In the embodiment shown in FIG. 1, an example in which an electronic device 100 is a television is used for description.

The electronic device 100 may include a housing 110 and a screen assembly 200.

The housing 110 may include a frame and a rear cover. The frame may be arranged around a periphery of the rear cover. The housing 110 may include, for example, a middle frame of the electronic device 100. In an example, the middle frame of the electronic device 100 may be accommodated in an inner periphery of the frame. In another example, the middle frame of the electronic device 100 may be used as a frame of the housing 110.

The screen assembly 200 may be an assembly that provides a display function for the electronic device 100. A user may watch the screen assembly 200 to enjoy media resources such as an image and a video. The screen assembly 200 may be mounted on the housing 110. A peripheral edge of the screen assembly 200 may abut against an inner edge of the frame. The frame may fix the screen assembly 200 on the housing 110. The screen assembly 200 and the rear cover may be separately mounted on two sides of the frame, so that the housing 110 may be a component inside the electronic device, specifically a component on the screen assembly 200, to provide a mechanical protection function. For example, the screen assembly 200 may be fixed on the middle frame of the electronic device 100.

The electronic device 100 may further include a control module. A specific implementation form of the control module may be, for example, a processor, a connector, a drive board, an integrated circuit, a chip, or the like. A control module may be configured, for example, on the screen assembly 200, and the control module may be accommodated in the housing 110. In an example, the control module may include at least one communication interface, a bus, at least one processor, and at least one memory. The at least one communication interface, the at least one processor, and the at least one memory may communicate with each other through the bus. The at least one communication interface may be configured to receive and send a signal. For example, a light emitting unit of the screen assembly 200 may be connected to one communication interface, so that the control module may trigger the light emitting unit to emit light. The at least one memory is configured to store application program code. The application program code may include, for example, code for controlling the light emitting unit to emit light or not to emit light. The at least one processor may be configured to execute the foregoing application program code, to control the light emitting unit. In this application, "at least one" includes, for example, "one or more".

Figure 2:
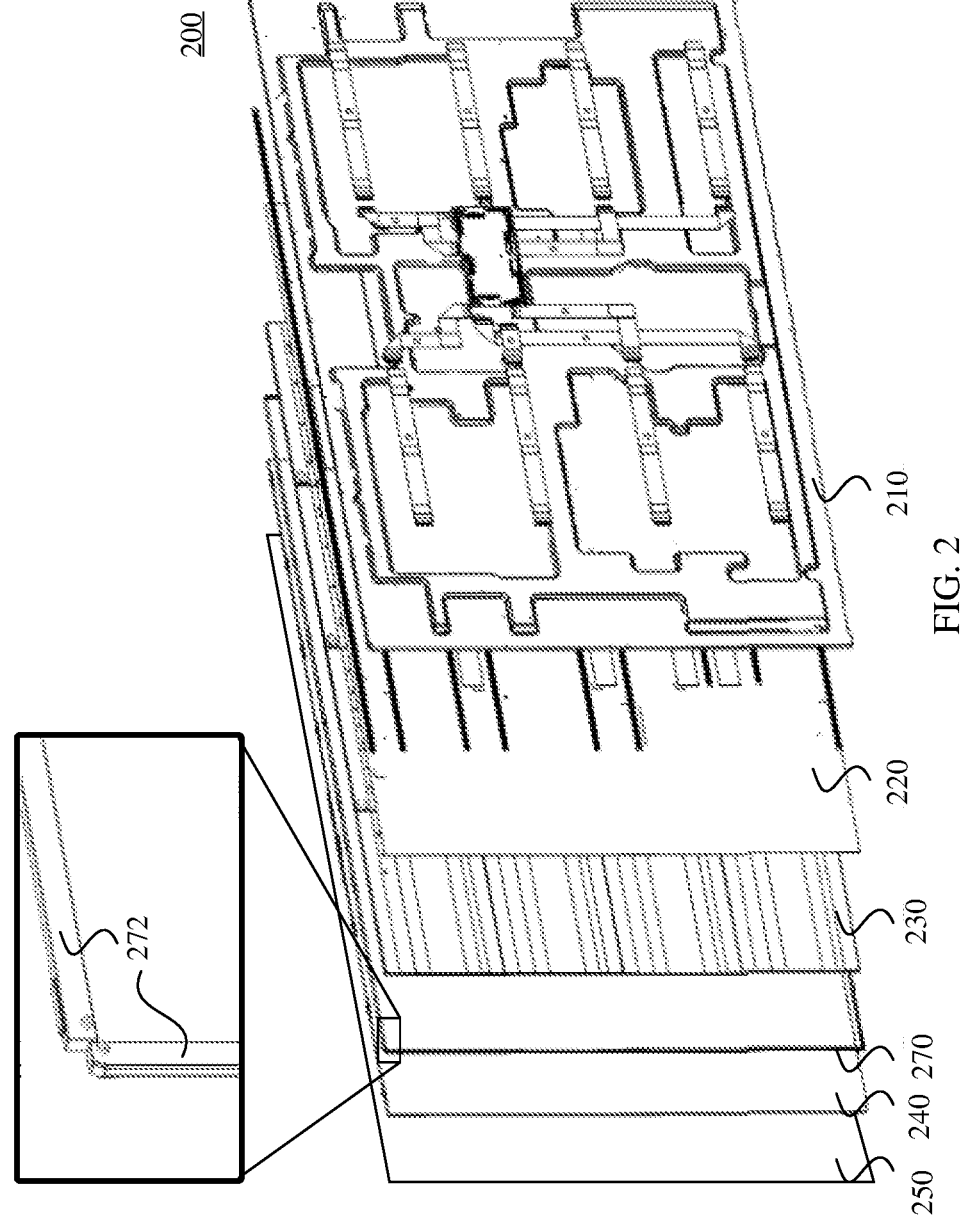
FIG. 2 is an exploded view of a screen assembly according to an embodiment of this application.
Figure 3:
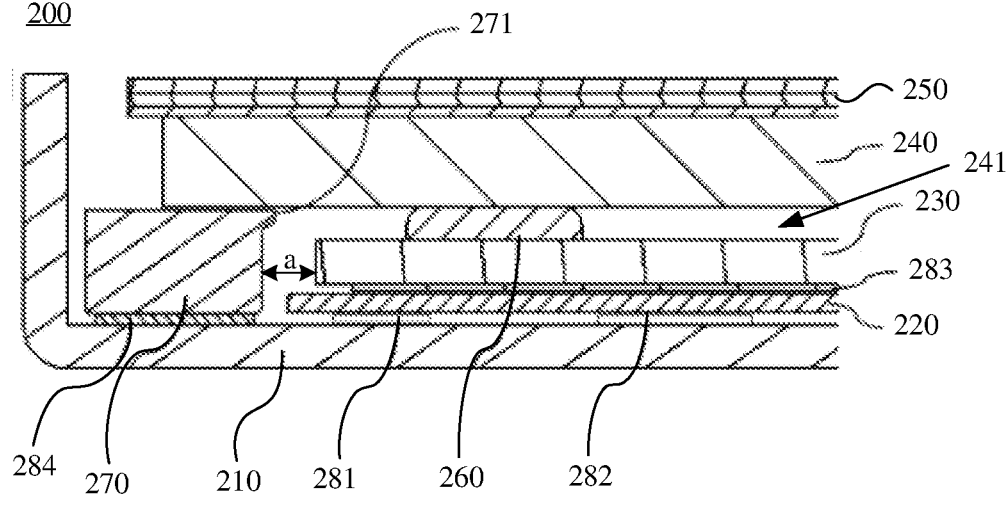
FIG. 3 is a schematic diagram of a structure of an electronic device according to an embodiment of this application.
Figure 4:
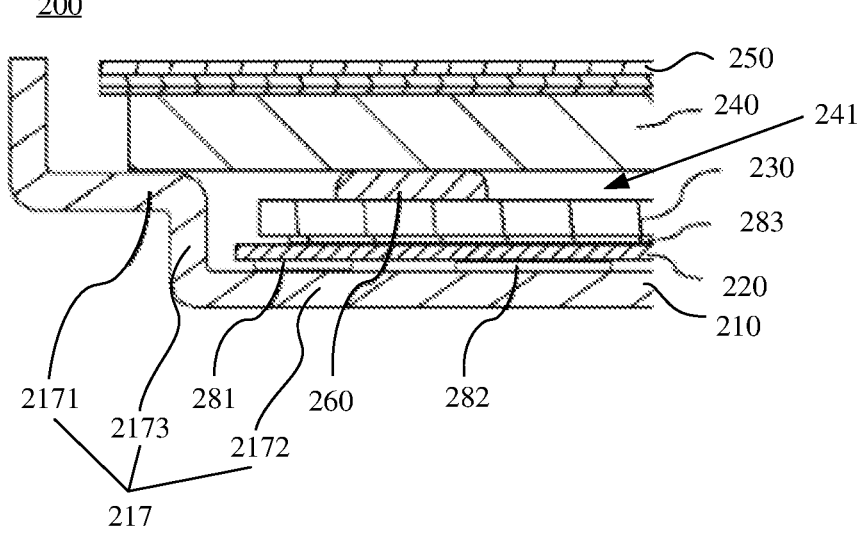
FIG. 4 is a schematic diagram of structure of another electronic device according to an embodiment of this application.

With reference to FIG. 2 to FIG. 4, the following describes the screen assembly 200 provided in embodiments of this application. FIG. 2 is an exploded view of the screen assembly 200. FIG. 3 is a schematic diagram of a structure of the screen assembly 200 according to an embodiment of this application. FIG. 4 is a schematic diagram of a structure of another screen assembly 200 according to an embodiment of this application.

The screen assembly 200 may include components such as a backplane 210, a flat panel 220, a mini-LED lighting panel 230, a diffusion panel 240, and an optical film 250 that are stacked.

The backplane 210 may have functions such as supporting the electronic device 100 and providing mechanical protection for an electronic component in the electronic device 100. The backplane 210 may be made of a material that satisfies a mechanical strength requirement and can take a support effect. For example, the backplane 210 may be made of a metal material such as stainless steel, aluminum alloy, zinc alloy, titanium alloy, or the like. For another example, the backplane 210 may be a non-metal material such as resin.

The backplane 210 may include a first backplane end face and a second backplane end face. The first backplane end face is close to the mini-LED lighting panel 230, and the second backplane end face is away from the mini-LED lighting panel 230. For a user, the first backplane end face may correspond to a front view of the electronic device 100, and the second backplane end face may correspond to a rear view of the electronic device 100. The front view of the electronic device 100 may be a side of the electronic device 100 that is often observed when the user uses the electronic device 100. The rear view of the electronic device 100 may be provided corresponding to the front view of the electronic device 100. The rear view of the electronic device 100 may be a side of the electronic device 100 that is seldom observed when the user uses the electronic device 100. For example, the electronic device 100 may be a television, a side of the television on which a screen assembly is mounted may be a front view of the television, and a side of the television on which a rear cover is mounted may be a rear view of the television. The first backplane end face corresponds to the front view of the electronic device 100, which may indicate that the first backplane end face may be observed when the backplane 210 is observed along a direction in which the user observes the front view of the electronic device 100. The second backplane end face corresponds to the rear view of the electronic device 100, which may indicate that the second backplane end face may be observed when the backplane 210 is observed along a direction in which the user observes the rear view of the electronic device 100. For ease of description, the first backplane end face may be referred to as a front view of the backplane 210, and the second backplane end face may be referred to as a rear view of the backplane 210.

In a possible example, the first backplane end face may be fixed on a rear cover of the housing 110. For example, the first backplane end face may be fixed on the rear cover of the housing 110 through a mechanical connecting member such as a screw, a double-faced adhesive, or foam. In another possible example, the first backplane end face may serve as, for example, a rear cover of the housing 110.

The flat panel 220 may be located between the mini-LED lighting panel 230 and the backplane 210. The flat panel 220 may be for supporting the mini-LED lighting panel 230, to maintain or ensure flatness of the mini-LED lighting panel 230. The flat panel 220 may be made of a conductive material with stiffness. For example, the flat panel 220 may be an aluminum plate. As shown in FIG. 3 and FIG. 4, the flat panel 220 may be fixed on the backplane 210, for example, through mechanical connecting members such as a double-faced adhesive 281 and foam 282.

In a possible scenario, in a process of transporting the electronic device 100, the electronic device 100 may collide, fall, or the like. In this case, the electronic device 100 may bear an external force to a specific extent. The backplane 210 may be correspondingly deformed to resist the external force. If the mini-LED lighting panel 230 is directly fixed on the backplane 210, the mini-LED lighting panel 230 may be relatively obviously deformed along with the backplane 210. To avoid the foregoing case, transportation difficulty of the electronic device 100 is increased. An obvious deformation of backplane 210 may impair a display effect of the mini-LED lighting panel 230. For example, because light mixing distances of different regions of the mini-LED lighting panel 230 are different, display problems such as uneven brightness and shadowing may occur on the electronic device 100.

The flat panel 220 is disposed between the backplane 210 and the mini-LED lighting panel 230, so that the flat panel 220 may take a transition effect between the mini-LED lighting panel 230 and the backplane 210 in terms of deformation. Deformation of the flat panel 220 may be less than deformation of the backplane 210, so that the deformation of the mini-LED lighting panel 230 may decrease. In other words, when the backplane 210 is relatively obviously deformed, the deformation of the mini-LED lighting panel 230 may be as small as possible or as inconspicuous as possible.

The mini-LED lighting panel 230 may be located on a side of the flat panel 220 away from the backplane 210. As shown in FIG. 3 and FIG. 4, for example, the mini-LED lighting panel 230 may be fixed on the flat panel 220 through a mechanical connecting member such as a thermally conductive adhesive 283. The thermally conductive adhesive 283 may help to transfer heat generated by the mini-LED lighting panel 230, thereby reducing an overheating possibility of the mini-LED lighting panel 230.

The diffusion panel 240 may be located on a side of the mini-LED lighting panel 230 away from the backplane 210. Light emitted by the mini-LED lighting panel 230 may pass through the diffusion panel 240 and enter from the electronic device 100. A light mixing space 241 may be formed between the diffusion panel 240 and the mini-LED lighting panel 230. A spacing between the diffusion panel 240 and the mini-LED lighting panel 230 is referred to as a light mixing distance.

In the examples shown in FIG. 3 and FIG. 4, the screen assembly 200 may include an optically transparent spacer 260. The optically transparent spacer 260 may be disposed on the mini-LED lighting panel 230, and is located between the mini-LED lighting panel 230 and the diffusion panel 240. The optically transparent spacer 260 may be for separating the mini-LED lighting panel 230 from the diffusion panel 240, to ensure that light emitted by the mini-LED lighting panel 230 may enter the diffusion panel 240 after passing through the light mixing space 241. A thickness of the optically transparent spacer 260 may be, for example, equal to or approximately equal to the light mixing distance.

The optical film 250 may change the frequency of the light from the mini-LED lighting panel 230. The optical film 250 may include a quantum dot. For example, the mini-LED lighting panel 230 may emit high-energy blue light. The blue light may stimulate a quantum dot encapsulated in the optical film 250, so that the quantum dot may convert the blue light emitted by the mini-LED lighting panel 230 into white light (where the quantum dot may be a nano-scale semiconductor; and with a specific electric field or light pressure applied on the quantum dot, the quantum dot may emit light with a specific frequency). The quantum dot may be formed, for example, in a chemical coating or phosphor. In a possible example, light emitted from the optical film 250 may enter, for example, a liquid crystal panel. The liquid crystal panel may include a liquid crystal layer and a light filter layer. Liquid crystal at the liquid crystal layer may control a liquid crystal unit to be turned on or off, to control light intensity of the white light passing through the liquid crystal unit. With the liquid crystal unit turned on, the white light passing through the liquid crystal unit can irradiate the filter layer. The optical filter layer may include a red light filter, a green light filter, and a blue light filter. The red light filter may be for converting the white light into red light. The green light filter may be for converting the white light into green light. The blue light filter may be for converting the white light into blue light. In this way, the electronic device 100 may be controlled to emit light of a plurality of colors, to display a color pattern.

In other examples, the diffusion panel 240 may include a quantum dot, so that the diffusion panel 240 may change the frequency of the light from the mini-LED lighting panel 230. In some embodiments, the diffusion panel 240 and the optical film 250 shown in FIG. 3 may be integrally formed.

The light emitted by the mini-LED lighting panel 230 may, for example, be directly incident on the diffusion panel 240 after only light mixing processing and without other optical processing. In other words, in some possible scenarios, no quantum dot may be configured on the light emitting unit of the mini-LED lighting panel 230. This can reduce structural complexity of the mini-LED lighting panel 230, and can arrange the light emitting units relatively closely on the mini-LED lighting panel 230. For example, a size of the phosphor is generally greater than a size of the light emitting unit of the mini-LED lighting panel 230. Packaging the phosphor on the mini-LED lighting panel 230 cannot closely arrange the light emitting units.

Figure 10:
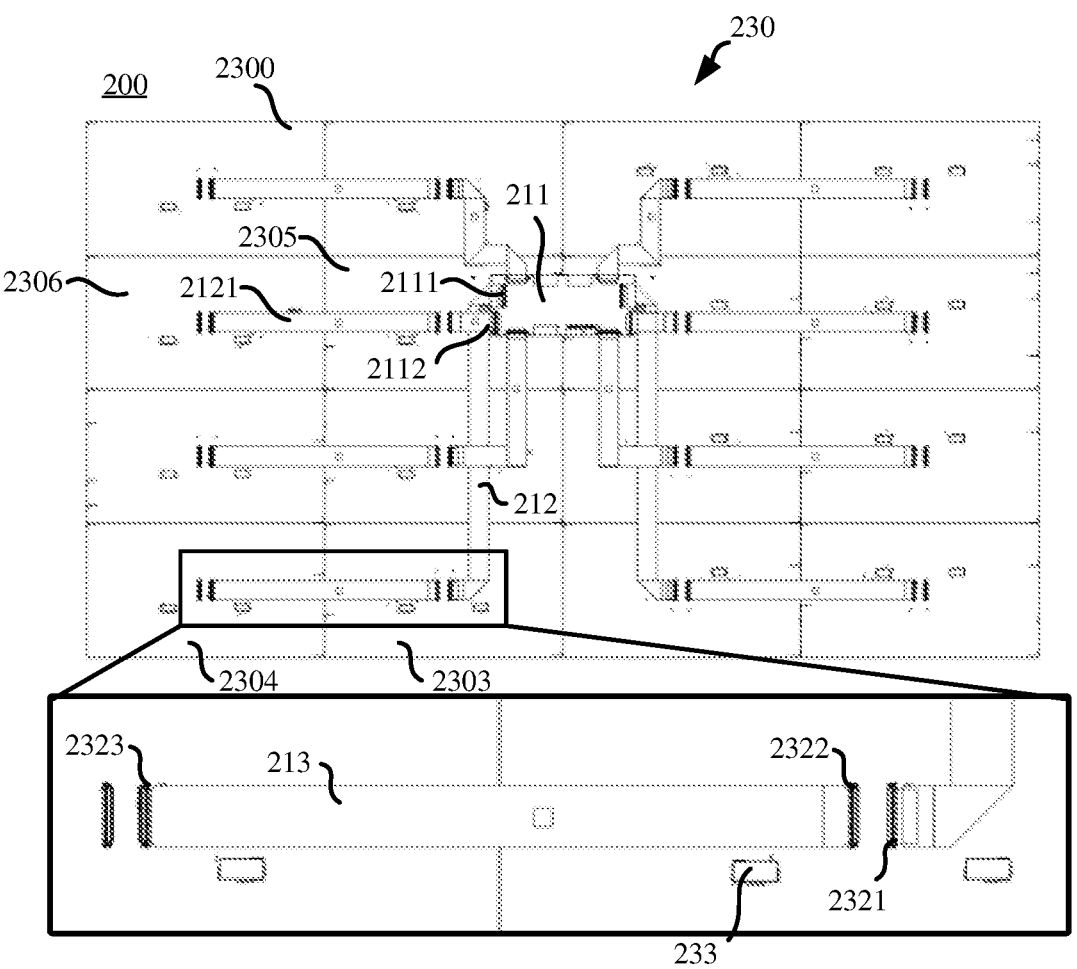
FIG. 10 is a schematic diagram of a structure of a drive circuit of a mini-LED lighting panel according to an embodiment of this application.

Optionally, as shown in FIG. 2 and FIG. 3, the screen assembly 200 may further include, for example, a diffusion panel support 270. As shown in FIG. 2, the diffusion panel support 270 may be in a rectangular frame shape. Refer to a partial enlarged diagram in FIG. 2. The diffusion panel support 270 may include, for example, four support columns 272. In one example, the four support columns 272 may be connected head to tail to form a rectangular diffusion panel support 270. A side surface of the diffusion panel support 270 close to the mini-LED lighting panel 230 may be provided in parallel with a side surface of the mini-LED lighting panel 230 at a spacing. It is assumed that a spacing between the side surface of the diffusion panel support 270 close to the mini-LED lighting panel 230 and the side surface of the mini-LED lighting panel 230 is a spacing a. As shown in FIG. 10 below, the mini-LED lighting panel 230 may include a plurality of sub-mini-LED lighting panels 2300. Sub-mini-LED lighting panels 2300 adjacent to the diffusion panel support 270 may be sub-mini-LED lighting panels 2300 located on an outer periphery of the mini-LED lighting panel 230, for example, a sub-mini-LED lighting panel 2303, a sub-mini-LED lighting panel 2304, or a sub-mini-LED lighting panel 2306.

Factors that may be considered for setting the spacing a may include, for example, dimension tolerances and assembly tolerances of components such as the backplane and the lighting panel.

Because a thermal diffusion coefficient of the diffusion panel support 270 is different from a thermal diffusion coefficient of the mini-LED lighting panel 230, when a temperature changes, the spacing a between the diffusion panel support 270 and the mini-LED lighting panel 230 may also change. Properly setting the spacing a can reduce a possibility that the side surface of the diffusion panel support 270 is in contact with the mini-LED lighting panel 230 in a temperature change scenario.

If the spacing a between the diffusion panel support 270 and the mini-LED lighting panel 230 is excessively small, light emitted from an edge region of the mini-LED lighting panel 230 may irradiate an inner wall of the diffusion panel support 270, and is reflected on the inner wall. This may affect a visual effect of the edge region of the mini-LED lighting panel 230. Around a central region of the mini-LED lighting panel 230, no obstruction similar to the diffusion panel support 270 exists. If intensity of the light from the mini-LED lighting panel 230 reflected by the diffusion panel support 270 is excessively high, display effects of the central region and the edge region of the mini-LED lighting panel 230 may vary greatly. Properly setting the spacing a can make the display effects of the central region and the edge region of the mini-LED lighting panel 230 (almost) the same. Alternatively, properly setting the spacing a may make at least a user (almost) unaware of a difference between the display effects of the central region and the edge region of the mini-LED lighting panel 230. In other words, the intensity of the light from the mini-LED lighting panel 230 reflected by the diffusion panel support 270 may be considered for setting of the spacing a. When the spacing a is proper, the intensity of the light from the mini-LED lighting panel 230 reflected by the diffusion panel support 270 may be less than preset light intensity.

The diffusion panel support 270 may be for supporting an edge region of the diffusion panel 240. In other words, the edge region of the diffusion panel 240 may be in contact with the diffusion panel support 270. The diffusion panel support 270 may enable the edge region of the diffusion panel 240 to be spaced from the mini-LED lighting panel 230.

In an example, for example, a second support end face of the diffusion panel support 270 may be provided on the backplane 210 through a double-faced adhesive 284. A thickness of the diffusion panel support 270 (that is, a spacing between a first support end face and the second support end face) may be (approximately) equal to a sum of the spacing between the mini-LED lighting panel 230 and the backplane 210, the light mixing distance, and the thickness of the mini-LED lighting panel 230.

In another example, the rear view of the diffusion panel support 270 may be further provided on, for example, the flat panel 220 or another structural member of the electronic device 100. The thickness of the diffusion panel support 270 may be correspondingly adjusted to adapt to the light mixing distance of the mini-LED lighting panel 230.

When the mini-LED lighting panel 230 does not work, a temperature of the diffusion panel 240 may be approximately the same as a room temperature, and an overall size of the diffusion panel 240 may be relatively small. When the mini-LED lighting panel 230 normally works, both the diffusion panel 240 and the mini-LED lighting panel 230 may expand when heated. However, thermal expansion coefficients of the diffusion panel 240 and the mini-LED lighting panel 230 are different, and expansion amounts of the diffusion panel 240 and the mini-LED lighting panel 230 are different. This means that, at least for a period of time in which the mini-LED lighting panel 230 has just started to work, a position of the edge region of the diffusion panel 240 relative to the mini-LED lighting panel 230 may change relatively significantly. In this embodiment of this application, the diffusion panel support 270 can support the diffusion panel 240 by setting the spacing a properly. When a size, a location, or the like of the diffusion panel 240 changes, in the edge region of the diffusion panel 240, a spacing change from the diffusion panel 240 to the mini-LED lighting panel 230 may be relatively small, or a spacing from the diffusion panel 240 to the mini-LED lighting panel 230 may be unchanged as much as possible. In other words, the light mixing distance may change slightly or may be basically unchanged. In this way, light mixing processing borne by light emitted from the edge region of the mini-LED lighting panel 230 may be approximately the same or basically unchanged, thereby preventing a user from sensing any light mixing effect difference.

In the example shown in FIG. 3, both the diffusion panel support 270 and the optically transparent spacer 260 may be for forming the light mixing space 241 between the diffusion panel 240 and the mini-LED lighting panel 230. It is assumed that in a central region of the diffusion panel 240, the light mixing distance between the diffusion panel 240 and the mini-LED lighting panel 230 is a light mixing distance 1; and in the edge region of the diffusion panel 240, the light mixing distance between the diffusion panel 240 and the mini-LED lighting panel 230 is a light mixing distance 2.

If only the diffusion panel support 270 is used, in the central region of the diffusion panel 240, no component spaces the diffusion panel 240 from the mini-LED lighting panel 230. Therefore, in the central region of the diffusion panel 240, a spacing between the diffusion panel 240 and the mini-LED lighting panel 230 cannot be ensured, so that the light mixing distance 1 and the light mixing distance 2 may differ greatly.

If only the optically transparent spacer 260 is used, in the edge region of the diffusion panel 240, no component spaces the diffusion panel 240 from the mini-LED lighting panel 230. Therefore, in the edge region of the diffusion panel 240, a spacing between the diffusion panel 240 and the mini-LED lighting panel 230 cannot be ensured, so that the light mixing distance 1 and the light mixing distance 2 may differ greatly.

That the light mixing distance 1 and the light mixing distance 2 differ greatly may lead to non-uniform light mixing effects when light emitted from the edge region of the diffusion panel 240 and light emitted from the central region of the diffusion panel 240 may resist light mixing processing with a relatively large difference, causing non-uniform light mixing effects.

If both the diffusion panel support 270 and the optically transparent spacer 260 are disposed, in the central region of the diffusion panel 240, the optically transparent spacer 260 may space the diffusion panel 240 from the mini-LED lighting panel 230; and in the edge region of the diffusion panel 240, the diffusion panel support 270 may space the diffusion panel 240 from the mini-LED lighting panel 230. This can make the light mixing distance b and the light mixing distance c approximately the same, and can ensure that the light emitted from the edge region and the central region of the diffusion panel 240 resist the approximately same light mixing processing, thereby improving light mixing uniformity of the electronic device 100.

In the example shown in FIG. 3, the diffusion panel support 270 may further include, for example, a support boss 271. The support boss 271 may extend from a body of the diffusion panel support 270 to the mini-LED lighting panel 230. The support boss 271 may be in contact with the diffusion panel 240. A surface of the support boss 271 in contact with the diffusion panel 240 may be a part of a surface of the diffusion panel support 270 in contact with the diffusion panel 240. The support boss 271 may help to increase a contact area between the diffusion panel support 270 and the diffusion panel 240.

As described above, the spacing between the side surface of the diffusion panel support 270 close to the mini-LED lighting panel 230 and the mini-LED lighting panel 230 may be the spacing a. In addition, the diffusion panel 240 may resist a plurality of thermal cycles of thermal expansion and cold contraction. If contraction of the diffusion panel 240 is relatively obvious, for example, a minimum spacing between the side surface of the diffusion panel 240 and the side surface of the mini-LED lighting panel 230 is less than the spacing a, that is, a plane in which the side surface of the diffusion panel 240 is located may be between the diffusion panel support 270 and the mini-LED lighting panel 230, the diffusion panel 240 may be at least partially detached from support of the diffusion panel support 270. In the edge region of the diffusion panel 240, if the diffusion panel 240 cannot be supported by the diffusion panel support 270, the light mixing distance between the diffusion panel 240 and the mini-LED lighting panel 230 becomes relatively unstable, affecting a light mixing effect.

In a possible manner, increasing the size of the diffusion panel 240 can ensure that the diffusion panel 240 is not detached from the diffusion panel support 270 even when the diffusion panel 240 contracts as small as possible. However, in this manner, a horizontal size and a vertical size of the electronic device 100 are increased (both a horizontal direction and a vertical direction may be perpendicular to a thickness direction, and the thickness direction may be perpendicular to the rear cover of the electronic device 100). When all of horizontally and vertically occupied areas of the mini-LED lighting panel 230 in the electronic device 100 are unchanged, increasing a horizontal size and a vertical size of the diffusion panel 240 may cause an increase in horizontally and vertically occupied areas of the electronic device 100, and may further reduce a screen ratio of the electronic device 100. In the example shown in FIG. 3, providing the support boss 271 on the diffusion panel support 270 can reduce a possibility that the diffusion panel 240 is detached from the diffusion panel support 270, and can further enable the diffusion panel 240 to have a relatively small size, thereby improving a screen ratio, lightness and thinness performance, and the like of the electronic device 100.

Optionally, as shown in FIG. 4, the backplane 210 may include a step structure 217. The backplane 210 may include a first stepped surface 2171, a second stepped surface 2172, and a stepped side surface 2173. The stepped side surface 2173 may be connected between the first stepped surface 2171 and the second stepped surface 2172. The diffusion panel 240 may be disposed on the first stepped surface 2171. The flat panel 220 may be disposed on the second stepped surface 2172. The mini-LED lighting panel 230 may be surrounded by the stepped side surface 2173. The stepped side surface 2173 may be spaced from the side surface of the mini-LED lighting panel 230. The example shown in FIG. 4 differs from the example shown in FIG. 3 in that the backplane 210 may directly provide mechanical support for the diffusion panel 240.

The mini-LED lighting panel 230 may include a plurality of sub-mini-LED lighting panels. The following describes a sub-mini-LED lighting panel 2300 as an example. The sub-mini-LED lighting panel 2300 may include a first lighting panel end face 2301 and a second lighting panel end face 2302.

Figure 5:
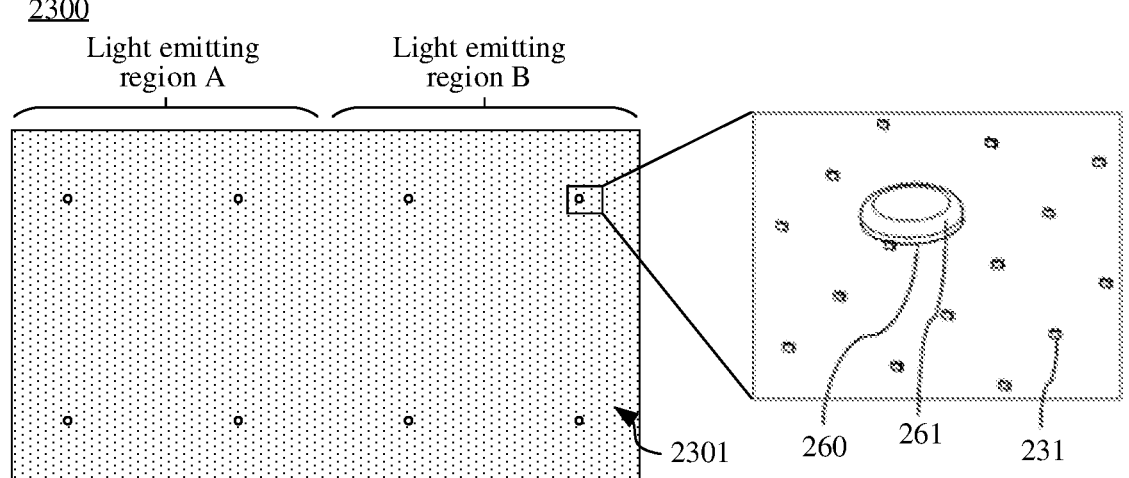
FIG. 5 is a schematic diagram of structure of a front view of a mini-LED lighting panel according to an embodiment of this application.

FIG. 5 is a schematic diagram of a structure of the first lighting panel end face 2301 of the sub-mini-LED lighting panel 2300 according to an embodiment of this application. Light emitted by the sub-mini-LED lighting panel 2300 may be emitted from the first lighting panel end face 2301 of the sub-mini-LED lighting panel 2300. The first lighting panel end face 2301 of the sub-mini-LED lighting panel 2300 may be a surface of the sub-mini-LED lighting panel 2300 close to the diffusion panel 240 and away from the backplane 210. For example, the first lighting panel end face 2301 may be divided into a light emitting region A and a light emitting region B. With reference to FIG. 3 to FIG. 5, the following describes the structure of the first lighting panel end face 2301 of the sub-mini-LED lighting panel 2300.

The sub-mini-LED lighting panel 2300 may include a plurality of light emitting units 231. For example, the sub-mini-LED lighting panel 2300 may include a plurality of light emitting units 231 arranged in an array. The light emitting unit 231 may be, for example, a chip having a light emitting function. Alternatively, the light emitting unit 231 may be a light emitting diode. FIG. 5 further shows a partial schematic diagram of the sub-mini-LED lighting panel 2300. With reference to FIG. 3 to FIG. 5, an optically transparent spacer 260 may be fix to a side of the sub-mini-LED lighting panel 2300 close to the diffusion panel 240. The optically transparent spacer 260 may be, for example, pasted on the mini-LED lighting panel 2300 through an optical transparent adhesive. In some possible scenarios, the transparent gasket 260 may cover the light emitting unit 231. Light emitted by the sub-mini-LED lighting panel 2300 may pass through the optically transparent spacer 260. An impact of the optically transparent spacer 260 on the light emitted by the mini-LED lighting panel 2300 may be as small as possible, so that a user (almost) does not perceive existence of the optically transparent spacer 260 from an appearance of the electronic device 100. In a possible example, the electronic device 100 may include a plurality of optically transparent spacers 260. The plurality of optically transparent spacers 260 may be, for example, arranged on the sub-mini-LED lighting panel 2300 in an array. As shown in FIG. 5, for example, eight optically transparent spacers 260 may be disposed on one sub-mini-LED lighting panel 2300.

FIG. 5 further shows a possible structure of the optically transparent spacer 260. The optically transparent spacer 260 may be in a shape such as a circle or an ellipse that has no corner or straight edge.

The optically transparent spacer 260 may include a curved surface 261, and the curved surface 261 is a curved surface connected between an end face and a side surface of the optically transparent spacer 260.

Providing the curved surface 261 on a side of the optically transparent spacer 260 close to the diffusion panel 240 can reduce a collision damage between the optically transparent spacer 260 and the diffusion panel 240. For example, in a process of transporting the electronic device 100, the diffusion panel 240 may be in thermal expansion and cold contraction. Therefore, the diffusion panel 240 may be in contact with the optically transparent spacer 260, but the diffusion panel 240 is not fixed on the optically transparent spacer 260. Therefore, the diffusion panel 240 may collide with the optically transparent spacer 260. Providing the curved surface 261 on a structure of the optically transparent spacer 260 can reduce a collision damage of the optically transparent spacer 260 to the diffusion panel 240.

Figure 6:
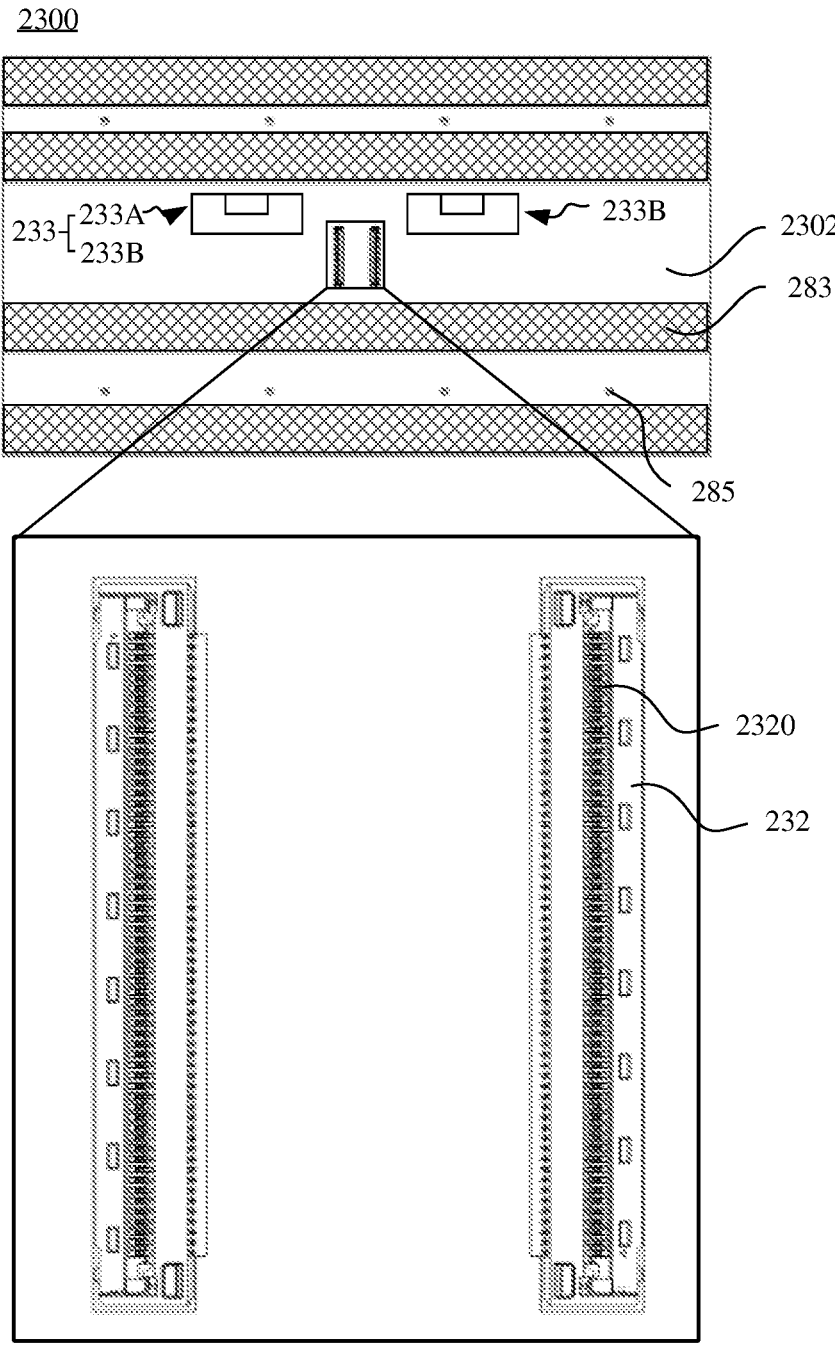
FIG. 6 is a schematic diagram of a structure of a rear view of a mini-LED lighting panel according to an embodiment of this application.

FIG. 6 is a schematic diagram of a structure of the second lighting panel end face 2302 of the sub-mini-LED lighting panel 2300 according to an embodiment of this application. The second lighting panel end face 2302 of the sub-mini-LED lighting panel 2300 may be provided close to the backplane 210 and away from the diffusion panel 240. With reference to FIG. 3 to FIG. 6, the following describes the structure of the second lighting panel end face 2302 of the mini-LED lighting panel 2300.

A double-faced adhesive may be provided on the second lighting panel end face 2302 of the sub-mini-LED lighting panel 2300, and the double-faced adhesive may fixedly connect the sub-mini-LED lighting panel 2300 and the flat panel 220. In a possible example, the double-faced adhesive may be the thermally conductive adhesive 283. Because the sub-mini-LED lighting panel 2300 may generate relatively high heat during working, the thermally conductive adhesive 283 helps to transfer the heat of the sub-mini-LED lighting panel 2300 to the flat panel 220, and helps to improve heat dissipation performance of the electronic device 100.

A conductive elastic piece 285 may be further disposed on the second lighting panel end face 2302 of the sub-mini-LED lighting panel 2300. One end of the conductive elastic piece 285 may be electrically connected to the sub-mini-LED lighting panel 2300. The other end of the conductive elastic piece 285 may abut against the flat panel 220. When the sub-mini-LED lighting panel 2300 works, the light emitting unit 231 of the sub-mini-LED lighting panel 2300 may accumulate electric charges. The mini-LED lighting panel 2300 may be grounded through the conductive elastic piece 285, thereby improving electromagnetic compatibility (electromagnetic compatibility, EMC) of the electronic device 100.

The sub-mini-LED lighting panel 2300 may further include one or more drive units 233 (which may also be referred to as control units) and one or more connectors 232.

A signal related to the sub-mini-LED lighting panel 2300 may be input to the drive unit 233 through the connector 232. In an example, the signal input to the signal drive unit 233 through the connector 232 may include an electrical signal and a control signal. The electrical signal may be for providing drive electric energy for the drive unit 233 and the light emitting unit 231. The control signal may indicate a brightness state of the light emitting unit 231 to the drive unit 233, so that the drive unit 233 may control the brightness state of the light emitting unit 231 based on the control signal. When the light emitting unit 231 is in a bright state, the light emitting unit 231 may be driven by the drive unit 233. Optionally, when the light emitting unit 231 is in the bright state, brightness of the light emitting unit 231 is adjustable. When the light emitting unit 231 is in a dim state, the light emitting unit 231 may be turned off by the drive unit 233 (that is, the light emitting unit 231 may not be driven).

As shown in a partially enlarged view in FIG. 6, in an example, the connector 232 may include a plurality of connector ports 2320. For example, the connector 232 may include 30 to 100 connector ports 2320. Correspondingly, the drive unit 233 may include a plurality of signal input ports corresponding to the plurality of connector ports. The plurality of connector ports and the plurality of signal input ports may be electrically connected in a one-to-one, one-to-multiple, or multiple-to-multiple correspondence manner, or the like.

Based on functions of the connector ports 2320, the connector 232 may include, for example, one or more electrical signal ports and one or more control signal ports. The electrical signal port may be configured to transmit an electrical signal. The control signal port may be configured to transmit a control signal. Correspondingly, based on functions of the signal input ports, the drive unit 233 may include, for example, one or more control signal input ports and one or more electrical signal input ports. The electrical signal input ports of the drive unit 233 may be electrically connected to the electrical signal ports of the connector 232. The control signal input ports of the drive unit 233 may be electrically connected to the control signal ports of the connector 232.

Optionally, the connector 232 may be further configured to transfer a signal for another sub-mini-LED lighting panel 2300 or another electronic component.

The drive unit 233 may be configured to drive each light emitting unit 231 of the sub-mini-LED lighting panel 2300, and control light emitting of each light emitting unit 231 of the sub-mini-LED lighting panel 2300. For example, the drive unit 233 may be configured to turn off the light emitting unit 231, control brightness of the light emitting unit 231, and the like. The drive unit 233 may be, for example, a drive integrated circuit (integrated circuit, IC) chip.

In the example shown in FIG. 6, the sub-mini-LED lighting panel 2300 may include two drive units 233: a drive unit 233A and a drive unit 233B. The drive unit 233A may drive the light emitting unit 231 located in the light emitting region A of the sub-mini-LED lighting panel 2300. The drive unit 233B may drive the light emitting unit 231 located in the light emitting region B of the sub-mini-LED lighting panel 2300. The light emitting region A and the light emitting region B may not overlap each other.

Figure 7:
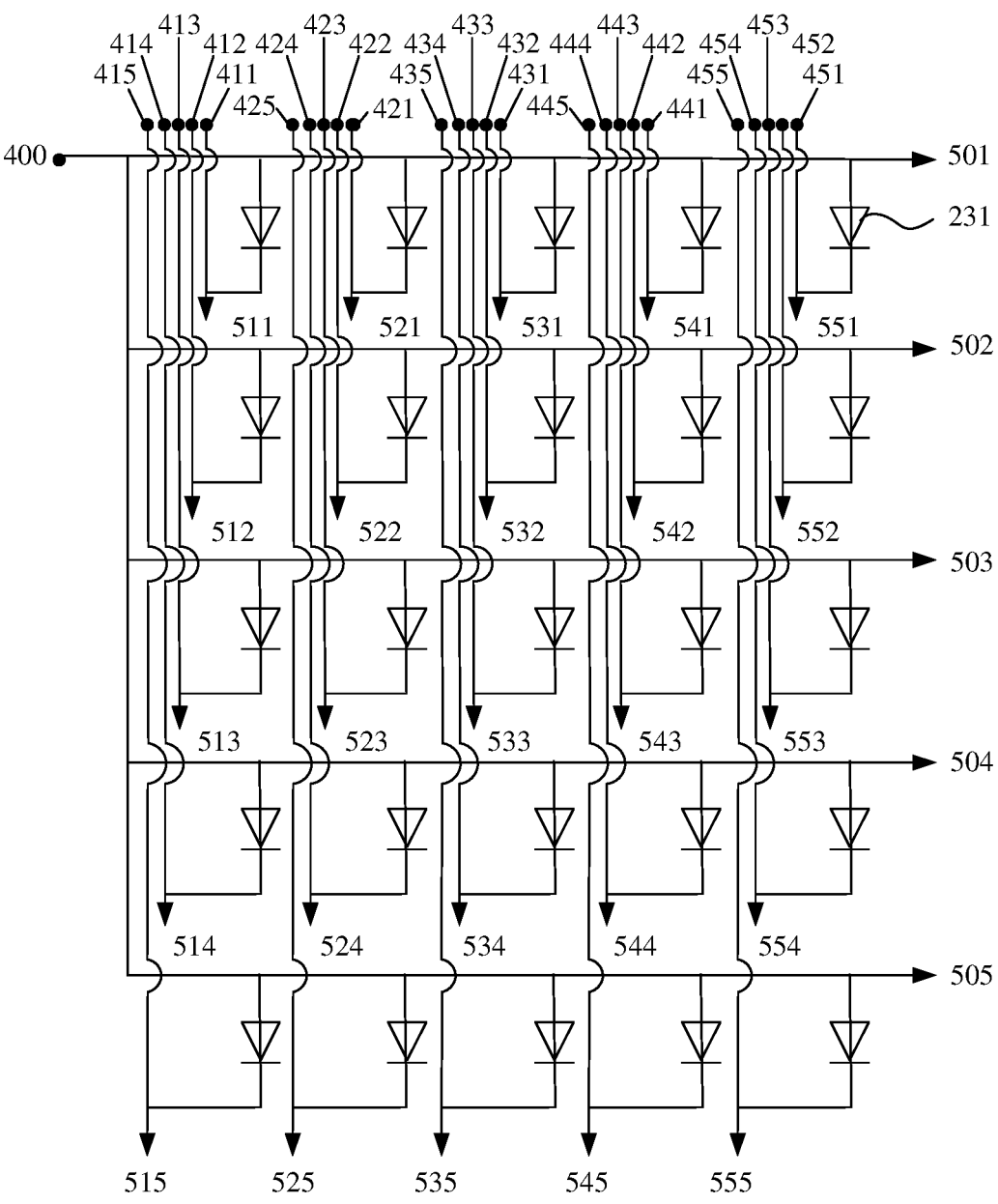
FIG. 7 is a schematic diagram of a structure of a drive circuit of a mini-LED lighting panel according to an embodiment of this application.

With reference to FIG. 6 to FIG. 7, the following describes a driving solution of the light emitting unit 231 by using the drive unit 233A as an example. Specific values mentioned below are merely for ease of description. Embodiments of this application are not intended to limit the following specific values.

To implement driving in the light emitting region A in blocks, that is, the light emitting region A may be divided into n light emitting blocks, any light emitting block in the light emitting region A may be separately controlled by the drive unit 233A. A plurality of light emitting units 231 in the light emitting region A may be divided into n light emitting unit groups. The n light emitting unit groups may be in a one-to-one correspondence with the n light emitting blocks in the light emitting region A. In other words, one or more light emitting units 231 in the light emitting block belong to and only belong to a corresponding light emitting unit group.

The drive unit 233A may further include, for example, a public electrical signal port and n drive ports, where n is an integer greater than 1. One or more public electrical connection cables and n drive cables may be configured in the light emitting region A of the sub-mini-LED lighting panel 2300. The public electrical signal port may be electrically connected to a public electrical connection cable. For example, the n drive cables may be in a one-to-one correspondence with the n drive ports of the drive unit 233A. Each drive port may be electrically connected to a corresponding drive cable. The n drive cables may be in a one-to-one correspondence with the n light emitting unit groups. Each drive cable may be electrically connected to each light emitting unit 231 in a corresponding light emitting unit group. In this way, all light emitting units in the light emitting unit group may be electrically connected to a same drive port. For example, all light emitting units in the light emitting unit group may be electrically connected to a same public electrical signal port.

In an example, it is assumed that there are 1000 light emitting units 231 in the light emitting region A. The drive unit 233A may include 50 ports: one public electrical signal port, 40 electrical signal ports, and nine control signal ports. The sub-mini-LED lighting panel 2300 may be configured with 40 drive cables electrically connected to the 40 electrical signal ports in a one-to-one manner, and a public electrical connection cable electrically connected to the public electrical signal port. As described above, the light emitting region A may be divided into 40 light emitting blocks, and a light emitting unit group corresponding to each light emitting block may include 25 light emitting units. In other words, the drive unit 233A may separately drive 25 light emitting units in one light emitting unit group.

In another example, it is assumed that there are 60 light emitting units 231 in the light emitting region A. The drive unit 233A may include 66 ports: one public electrical signal port, 60 electrical signal ports, and six control signal ports. The sub-mini-LED lighting panel 2300 may be configured with 60 drive cables electrically connected to the 60 electrical signal ports in a one-to-one manner, and a public electrical connection cable electrically connected to the public electrical signal port. As described above, the light emitting region A may be divided into 60 light emitting blocks, and a light emitting unit group corresponding to each light emitting block may include one light emitting unit. In other words, the drive unit 233A may separately drive one light emitting unit.

As described above, when there are a small quantity of ports of the drive unit 233 and a large quantity of light emitting units 231 in the light emitting region, if it is expected that a quantity of light emitting units 231 that can be separately controlled may be as small as possible, a quantity of drive units 233 may be relatively large; if it is expected that a quantity of drive units 233 disposed on the sub-mini-LED lighting panel 2300 is as small as possible, a quantity of light emitting units 231 that can be separately controlled may be relatively large.

FIG. 7 shows a possible drive circuit for separately driving each light emitting unit 231 in 25 light emitting units 231.

The drive circuit may include five public electrical connection cables: a public electrical connection cable 501, a public electrical connection cable 502, a public electrical connection cable 503, a public electrical connection cable 504, and a public electrical connection cable 505. The five public electrical connection cables are all electrically connected to a public electrical signal port 400.

The drive circuit may further include 25 drive cables: a drive cable 511, a drive cable 512, a drive cable 513, a drive cable 514, a drive cable 515, a drive cable 521, a drive cable 522, a drive cable 523, a drive cable 524, a drive cable 525, a drive cable 531, a drive cable 532, a drive cable 533, a drive cable 534, a drive cable 535, a drive cable 541, a drive cable 542, a drive cable 543, a drive cable 544, a drive cable 545, a drive cable 551, a drive cable 552, a drive cable 553, a drive cable 554, and a drive cable 555.

25 drive ports that are electrically connected to the 25 drive cables in a one-to-one manner may be: a drive port 411, a drive port 412, a drive port 413, a drive port 414, a drive port 415, a drive port 421, a drive port 422, a drive port 423, a drive port 424, a drive port 425, a drive port 431, a drive port 432, a drive port 433, a drive port 434, a drive port 435, a drive port 441, a drive port 442, a drive port 443, a drive port 444, a drive port 445, a drive port 451, a drive port 452, a drive port 453, a drive port 454, and a drive port 455.

The drive circuit may include 25 light emitting units 231 arranged in a 5×5 array. It is assumed that the light emitting unit 231 (x, y) may represent a light emitting unit 231 in an $x^{th}$ row and a $y^{th}$ column ($1 \le x \le 5$, $1 \le y \le 5$, and both x and y are integers). In this case, one end of the light emitting unit 231 (x, y) may be electrically connected to the public electrical signal port 400 through a public electrical connection cable 50x, and the other end of the light emitting unit 231 (x, y) may be electrically connected to a drive port 4yx through a drive cable 5yx. By controlling a voltage difference between the public electrical signal port 400 and the drive port 4yx, a load voltage of the light emitting unit 231 (x, y) may be controlled (where the load voltage of the light emitting unit 231 may be a voltage difference between two ends of the light emitting unit 231).

In an example, the light emitting unit 231 (2, 3) may be a light emitting unit in the second row and the third column. One end of the light emitting unit 231 (2, 3) may be electrically connected to the public electrical signal port 400 through the public electrical connection cable 502. The other end of the light emitting unit 231 (2, 3) may be electrically connected to the drive port 432 through the drive cable 532. By controlling a voltage difference between the public electrical signal port 400 and the drive port 432, a load voltage of the light emitting unit 231 (2, 3) may be controlled (where the load voltage of the light emitting unit may be a voltage difference between two ends of the light emitting unit).

Because the drive port 4yx may not be electrically connected to other light emitting units except the light emitting unit 231 (x, y), the drive circuit shown in FIG. 7 enables the load voltage of the light emitting unit 231 (x, y) to be separately controlled by the drive unit 233.

For the drive circuit that separately drives a light emitting unit group including a plurality of light emitting units 231, refer to the example shown in FIG. 7.

In a method for driving the light emitting unit 231, the electronic device 100 may turn on, by controlling a voltage difference between a public electrical signal port and a drive port, all light emitting units 231 in a light emitting unit group corresponding to the drive port.

For example, a first light emitting unit group includes m light emitting units 231. The m light emitting units 231 are connected in series. The first light emitting unit group corresponds to a first drive port. The electronic device 100 may determine that a voltage difference between the public electrical signal port and the first drive port is higher than a first preset voltage. The first preset voltage may be equal to or higher than m×V1. V1 may be a working voltage of the light emitting unit 231.

For another example, the first light emitting unit group includes m light emitting units 231. The m light emitting units 231 are connected in parallel. The first light emitting unit group corresponds to the first drive port. The electronic device 100 may determine that a voltage difference between the public electrical signal port and the first drive port is higher than a first preset voltage. The first preset voltage may be equal to or higher than V1. V1 may be a working voltage of the light emitting unit 231.

As shown in FIG. 7, the electronic device 100 may turn on the light emitting unit 231 (2, 3) by controlling a voltage difference between the public electrical signal port 400 and the drive port 432. The electronic device 100 may determine that a voltage difference between the public electrical signal port 400 and the drive port 432 is higher than a first preset voltage. The first preset voltage may be equal to or higher than a working voltage of the light emitting unit 231 (2, 3).

In a method for driving the light emitting unit 231, the electronic device 100 may turn off, by controlling a voltage difference between a public electrical signal port and a drive port, all light emitting units 231 in a light emitting unit group corresponding to the drive port.

For example, the first light emitting unit group includes m light emitting units 231. The m light emitting units 231 are connected in series. The first light emitting unit group corresponds to the first drive port. The electronic device 100 may determine that a voltage difference between the public electrical signal port and the first drive port is lower than a second preset voltage. The second preset voltage may be equal to or lower than m×V1. V1 may be a working voltage of the light emitting unit 231.

For another example, the first light emitting unit group includes m light emitting units 231. The m light emitting units 231 are connected in parallel. The first light emitting unit group corresponds to the first drive port. The electronic device 100 may determine that a voltage difference between the public electrical signal port and the first drive port is lower than a second preset voltage. The second preset voltage may be equal to or lower than V1. V1 may be a working voltage of the light emitting unit 231.

As shown in FIG. 7, the electronic device 100 may turn off the light emitting unit 231 (2, 3) by controlling a voltage difference between the public electrical signal port 400 and the drive port 432. The electronic device 100 may determine that a voltage difference between the public electrical signal port 400 and the drive port 432 is lower than a second preset voltage. The second preset voltage may be equal to or lower than a working voltage of the light emitting unit 231 (2, 3).

In a method for driving the light emitting unit 231, the electronic device 100 may control, by controlling a voltage difference between a public electrical signal port and a drive port, emitting brightness of all light emitting units 231 in a light emitting unit group corresponding to the drive port.

For example, the first light emitting unit group includes m light emitting units 231. The m light emitting units 231 are connected in series. The first light emitting unit group corresponds to the first drive port. The electronic device 100 may increase the voltage difference between the public electrical signal port and the first drive port by m×V2, so that the load voltage of each light emitting unit 231 may be increased by V2 to increase the emitting brightness of the light emitting unit 231. The electronic device 100 may decrease the voltage difference between the public electrical signal port and the first drive port by m×V3, so that the load voltage of each light emitting unit 231 may be decreased by V3 to decrease the emitting brightness of the light emitting unit 231.

For example, the first light emitting unit group includes m light emitting units 231. The m light emitting units 231 are connected in parallel. The first light emitting unit group corresponds to the first drive port. The electronic device 100 may increase the voltage difference between the public electrical signal port and the first drive port by V2, so that the load voltage of each light emitting unit 231 may be increased by V2 to increase the emitting brightness of the light emitting unit 231. The electronic device 100 may decrease the voltage difference between the public electrical signal port and the first drive port by V3, so that the load voltage of each light emitting unit 231 may be decreased by V3 to decrease the emitting brightness of the light emitting unit 231.

As shown in FIG. 7, the electronic device 100 may control emitting brightness of the light emitting unit 231 (2, 3) by controlling a voltage difference between the public electrical signal port 400 and the drive port 432. For example, the electronic device 100 may increase the voltage difference between the public electrical signal port 400 and the drive port 432, to increase light emitting brightness of the light emitting unit 231 (2, 3). The electronic device 100 may decrease the voltage difference between the public electrical signal port 400 and the drive port 432 to reduce the emitting brightness of the light emitting unit 231 (2, 3).

In an example, the electronic device 100 may display a target image, and the target image may include a plurality of pixels. The electronic device 100 may control a brightness state of a corresponding light emitting unit group based on a pixel value of a pixel. For example, if a pixel value of a pixel p is corresponding to black, the drive unit 233 may stop driving a light emitting unit group p corresponding to the pixel p, that is, turn off all light emitting units 231 in the light emitting unit group p. The light emitting unit group p may include one or more light emitting units 231.

In an example, the electronic device 100 may display a target image, the target image may include a plurality of image blocks (where the image block may also be referred to as a tree block, a coding unit, a coding node, or the like), and the image blocks may be obtained by dividing the target image. Each image block may include a plurality of pixels. The electronic device 100 may control a brightness state of a corresponding light emitting unit group based on an image block. For example, an image block q includes a plurality of pixels q, a light emitting unit group q includes a plurality of light emitting units 231q, and the image block q may correspond to the light emitting unit group q. If pixel values of all pixels q in the image block q all correspond to black, the sub-mini-LED lighting panel 2300 may stop driving the light emitting unit group q corresponding to the image block q, that is, turn off all light emitting units 231 in the light emitting unit group q. The light emitting unit group q may include one or more light emitting units 231.

Figure 8:
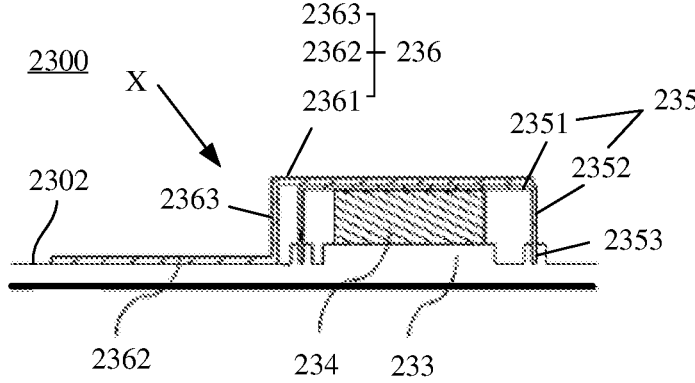
FIG. 8 is a partial sectional view of a mini-LED lighting panel according to an embodiment of this application.

FIG. 8 is a partial sectional view of the sub-mini-LED lighting panel 2300.

As described above, the sub-mini-LED lighting panel 2300 may include one or more drive units 233. To improve use performance of the drive unit 233, the sub-mini-LED lighting panel 2300 may further include other components.

For example, the sub-mini-LED lighting panel 2300 may further include a shielding can 235. The shielding can 235 may be provided on the second lighting panel end face 2302 of the sub-mini-LED lighting panel 2300. A cavity may be formed between the shielding can 235 and the second lighting panel end face 2302. The drive unit 233 may be accommodated in the cavity, so that the shielding can 235 may be for shielding a signal for the drive unit 233.

The shielding can 235 may include a shielding cover 2351 and a shielding frame 2352. The shielding cover 2351 and the shielding frame 2352 may be provided separately or integrally. The shielding frame 2352 may be located between the shielding cover 2351 and the second lighting panel end face 2302. One end of the shielding frame 2352 may be fixed on the second lighting panel end face 2302. The other end of the shielding frame 2352 may be connected to the shielding cover 2351. Optionally, the second lighting panel end face 2302 may include one or more slots 2353. One end of the shielding frame 2352 away from the shielding cover 2351 is inserted into the slot 2353 to be fixed on the mini-LED lighting panel 2300.

For another example, the sub-mini-LED lighting panel 2300 may further include a heat conducting block 234. The heat conducting block 234 may be provided on the drive unit 233. The heat conducting block 234 may be for conducting heat on the drive unit 233. In the example shown in FIG. 8, the heat conducting block 234 may be located between the shielding cover 2351 and the drive unit 233, and is in contact with the shielding cover 2351, so that heat of the heat conducting block 234 may be further conducted to the shielding can 235.

Figure 9:
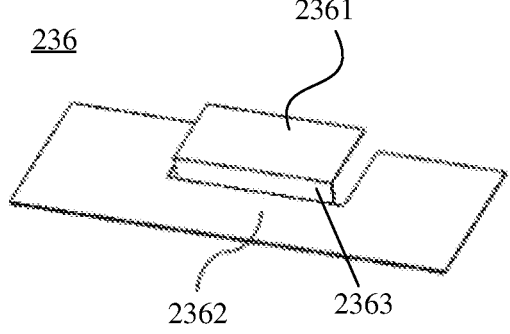
FIG. 9 is a schematic diagram of a structure of a heat conducting film according to an embodiment of this application.

In the example shown in FIG. 8, the sub-mini-LED lighting panel 2300 may further include a heat conducting film 236. The heat conducting film 236 may be made of a material having high thermal conductivity, such as silver, copper, and graphite. The heat conducting film 236 may include a first part 2361, a second part 2362, and a third part 2363. The first part 2361 may be pasted on a side of the shielding cover 2351 away from the heat conducting block 234 (that is, a top surface of the shielding can 235). In this way, heat on the shielding can 235 may be further conducted to the heat conducting film 236. The second part 2362 may be pasted on the second lighting panel end face 2302. The third part 2363 may be connected between the first part 2361 and the second part 2362. For example, the third part 2363 may be provided in parallel with one or more side surfaces of the shielding frame 2352 (that is, a side surface of the shielding can 235). A schematic diagram of a structure of the heat conducting film 236 shown in FIG. 9 may be obtained by observing the heat conducting film 236 along an X direction shown in FIG. 8. As shown in FIG. 9, the third part 2363 may be provided in parallel with one side surface of the shielding frame 2352. Remaining side surfaces of the shielding frame 2352 may not be covered by the heat conducting film 236. In this way, heat on the heat conducting film 236 may be further conducted to the second lighting panel end face 2302. This can reduce an overheating probability of the drive unit 233.

The heat conducting film 236 shown in FIG. 9 may be obtained by cutting a raw material of the heat conducting film 236. For example, two parallel lines may be cut out from an edge of the heat conducting film 236 to the center of the heat conducting film 236, and the heat conducting film 236 is not completely cut off. The two line segments may not be connected to each other, and lengths of the two lines may be approximately the same. After being cut, the heat conducting film 236 may form the first part 2361, the second part 2362, and the third part 2363. The first part 2361 may be bent relative to the third part 2363, and the third part 2363 may be bent relative to the second part 2362. A plurality of parts of the heat conducting film 236 may be correspondingly coated on the shielding can 235 and the second lighting panel end face 2302.

In another possible example, the raw material of the heat conducting film 236 may have another cutting manner or shape, so that the heat conducting film 236 may cover a plurality of side surfaces of the shielding frame 2352.

The heat conducting film 236 may have softness. If the heat conducting film 236 directly covers the periphery of the shielding can 235 without being cut, the heat conducting film 236 may be wrinkled. Cutting the heat conducting film 236 can reduce a possibility of the heat conducting film 236 being wrinkled, and improve bonding performance between the heat conducting film 236 and the shielding can 235, and between the heat conducting film 236 and the second lighting panel end face 2302.

In another example, the sub-mini-LED lighting panel 2300 may include one or two of the heat conducting block 234, the shielding can 235, and the heat conducting film 236. For example, the sub-mini-LED lighting panel 2300 may include only the heat conducting block 234 and the heat conducting film 236. The heat conducting film 236 may be connected between the heat conducting block 234 and the second lighting panel end face 2302. For another example, the sub-mini-LED lighting panel 2300 may include only the heat conducting film 236. The heat conducting film 236 may be in contact with a heat emitting surface of the drive unit 233, and is connected between the drive unit 233 and the second lighting panel end face 2302.

Figure 11:
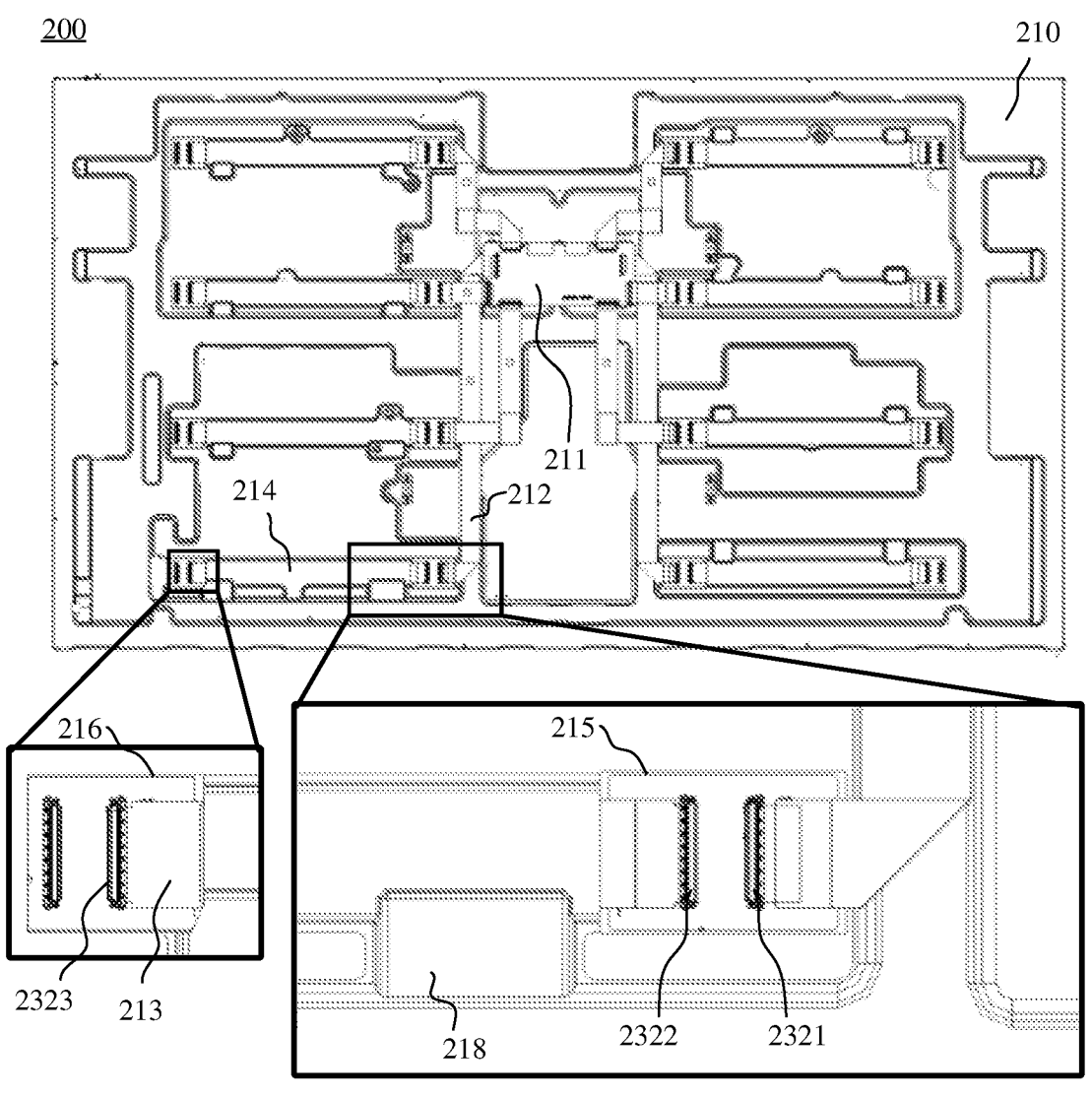
FIG. 11 is a schematic diagram of a structure of a rear view of a backplane according to an embodiment of this application.

With reference to FIG. 10 and FIG. 11, the following describes an electrical connection relationship between the mini-LED lighting panel 230 and components provided on the backplane 210.

The mini-LED lighting panel 230 may include a plurality of sub-mini-LED lighting panels 2300. As shown in FIG. 10, a screen assembly 200 may include 16 sub-mini-LED lighting panels 2300. In other examples, the mini-LED lighting panel 230 may include more or fewer sub-mini-LED lighting panels 2300.

The screen assembly 200 may further include a drive module 211. The drive module 211 may be provided on a rear view of the backplane 210.

The drive module 211 may be configured to input signals to the plurality of sub-mini-LED lighting panels 2300. The drive module 211 may include a plurality of power ports. A signal output by one power port may be input to at least one mini-LED lighting panel group. One mini-LED lighting panel group may include at least two sub-mini-LED lighting panels 2300. As shown in FIG. 10, the drive module 211 may include eight power ports. A signal output by a first power port 2111 may be input to a first mini-LED lighting panel group through an electrical connecting member 212. The first mini-LED lighting panel group may include a sub-mini-LED lighting panel 2303 and a sub-mini-LED lighting panel 2304. A signal output by a second power port 2112 may be input to a second mini-LED lighting panel group through the electrical connecting member 2121. The second mini-LED lighting panel group may include a sub-mini-LED lighting panel 2305 and a sub-mini-LED lighting panel 2306.

The following uses the first sub-mini-LED lighting panel 2303 and the second sub-mini-LED lighting panel 2304 identified in FIG. 10 as an example for description.

The first sub-mini-LED lighting panel 2303 may include a first connector 2321. For example, the first connector 2321 of the first sub-mini-LED lighting panel 2303 may be electrically connected to the power port 2111 of the drive module 211 by using the first electrical connecting member 212 (where the electrical connecting member may be, for example, a flexible circuit board). A signal from the drive module 211 may be input to the drive unit 233 of the first sub-mini-LED lighting panel 2303 through the first connector 2321, to drive the plurality of first light emitting units on the first sub-mini-LED lighting panel 2303. As shown in FIG. 11, the first electrical connecting member 212 may be bent or folded, to reduce space occupied by the first electrical connecting member 212 in the electronic device 100.

Based on functions of signals, the signals input by the drive module 211 to the first connector 2321 may include an electrical signal and a control signal. With reference to the foregoing descriptions, the electrical signal may be correspondingly input to an electrical signal port of the first connector 2321, and the control signal may be correspondingly input to a control signal port of the first connector 2321. The electrical signal may be for providing drive electric energy for the drive unit 233 and the light emitting unit 231. The control signal may indicate a brightness state of the light emitting unit 231 to the drive unit 233, so that the drive unit 233 may control the brightness state of the light emitting unit 231 based on the control signal.

In an example, the electronic device displays a target image. A first image region of the target image corresponds to the first sub-mini-LED lighting panel 2303. Imaging of the first image region is implemented by the first sub-mini-LED lighting panel 2303. The drive module 211 may input a first control signal to the drive unit 233 of the first sub-mini-LED lighting panel 2303 through the first connector 2321. The first control signal may indicate a pixel value of a pixel in the first image region. The drive unit 233 of the first sub-mini-LED lighting panel 2303 may control the brightness state of the light emitting unit 231 of the first sub-mini-LED lighting panel 2303 based on the pixel value of the pixel in the first image region. For a specific implementation in which the drive unit 233 drives the plurality of light emitting units 231, refer to the foregoing descriptions.

Because the drive module 211 and the first sub-mini-LED lighting panel 2303 are respectively located on two sides of the backplane 210, as shown in FIG. 11, the backplane 210 may include a first backplane through hole 215, and the first backplane through hole 215 is provided corresponding to the first connector 2321. The first electrical connecting member 212 may pass through the first backplane through hole 215 to implement an electrical connection between the first electrical connecting member 212 and the first connector 2321.

The first sub-mini-LED lighting panel 2303 may further include a second connector 2322, and the second connector 2322 may be connected in series with the first connector 2321. The second sub-mini-LED lighting panel 2304 may include a third connector 2323. For example, the second connector 2322 of the first sub-mini-LED lighting panel 2303 may be electrically connected to the third connector 2323 of the second sub-mini-LED lighting panel 2304 through the second electrical connecting member 213. An electrical signal from the drive module 211 may be input to the drive unit 233 of the second sub-mini-LED lighting panel 2304 through the first electrical connecting member 212, the first connector 2321, the second connector 2322, the second electrical connecting member 213, and the third connector 2323, to drive the plurality of second light emitting units on the second sub-mini-LED lighting panel 2304. As described above, the first sub-mini-LED lighting panel 2303 and the second sub-mini-LED lighting panel 2304 may be connected in series. As shown in FIG. 11, the second electrical connecting member 213 may be located between the backplane 210 and the flat panel 220.

In an example, the electronic device displays a target image. A second image region of the target image corresponds to the second sub-mini-LED lighting panel 2304. Imaging of the second image region is implemented by the second sub-mini-LED lighting panel 2304. The drive module 211 may input a second control signal to the drive unit 233 of the second sub-mini-LED lighting panel 2304 through the first connector 2321. The second control signal may indicate a pixel value of a pixel in the second image region. The drive unit 233 of the second sub-mini-LED lighting panel 2304 may control the brightness state of the light emitting unit 231 of the second sub-mini-LED lighting panel 2304 based on the pixel value of the pixel in the second image region.

With reference to the foregoing descriptions, the first control signal and the second control signal that may be output by the drive module 211 may both pass through the first connector 2321. Optionally, the first control signal may carry a first lighting panel identifier. The first lighting panel identifier may be an identifier of the first sub-mini-LED lighting panel 2303. The second control signal may carry a second lighting panel identifier. The second lighting panel identifier may be an identifier of the second sub-mini-LED lighting panel 2303. This can avoid confusion of control signals of different mini-LED lighting panels 230. After mounting the backplane 210, the flat panel 220, the first sub-mini-LED lighting panel 2303, and the second sub-mini-LED lighting panel 2304, an assembler or a robotic arm may connect the second electrical connecting member 213 between the second connector 2322 of the first sub-mini-LED lighting panel 2303 and the third connector 2323 of the second sub-mini-LED lighting panel 2304. The drive module 211 and the first sub-mini-LED lighting panel 2303 are respectively located on two sides of the backplane 210, and the drive module 211 and the second sub-mini-LED lighting panel 2304 are respectively located on two sides of the backplane 210. For ease of assembly, as shown in FIG. 11, the backplane 210 may include a through hole corresponding to the second connector 2322 and a through hole corresponding to the third connector 2323. The assembler or the robotic arm may implement an electrical connection between the second electrical connecting member 213 and the second connector 2322 through the through hole corresponding to the second connector 2322. The assembler or the robotic arm may implement an electrical connection between the second electrical connecting member 213 and the third connector 2323 through the through hole corresponding to the third connector 2323.

In the example shown in 11, the through hole corresponding to the second connector 2322 may be a first backplane through hole 215, and the through hole corresponding to the third connector 2323 may be a second backplane through hole 216.

In another example, the drive module 211 may be provided on a front view of the backplane 210 or a rear view of the flat panel 220, and the backplane 210 may not include the first backplane through hole 215 and the second backplane through hole 216 shown in FIG. 11.

Optionally, the screen assembly 200 may further include a third sub-mini-LED lighting panel 2307. The drive module 211 may input a signal to the third sub-mini-LED lighting panel 2307 through the first sub-mini-LED lighting panel 2303 or the second sub-mini-LED lighting panel 2304.

Figure 12:
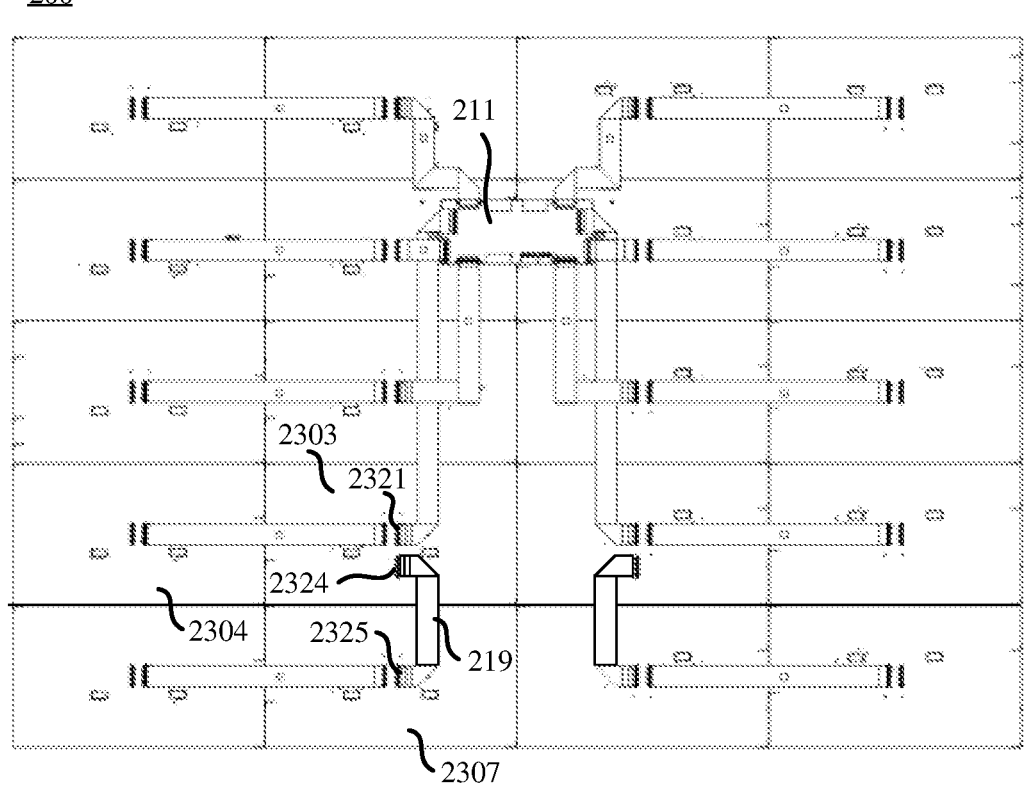
FIG. 12 is a schematic diagram of a structure of a drive circuit of another mini-LED lighting panel according to an embodiment of this application.

In an example, as shown in FIG. 12, the first sub-mini-LED lighting panel 2303 may include a fourth connector 2324. The fourth connector 2324 may be electrically connected to the first connector 2321. The third sub-mini-LED lighting panel 2307 may include a fifth connector 2325. The fourth connector 2324 of the first sub-mini-LED lighting panel 2303 and the fifth connector 2325 of the third sub-mini-LED lighting panel 2307 may be electrically connected through a third electrical connecting member 219. In this case, the second sub-mini-LED lighting panel 2304 may be connected in parallel to the third sub-mini-LED lighting panel 2307. In other words, signals from the drive module 211 may be streamed on the first sub-mini-LED lighting panel 2303, so that the signals may be input to the second sub-mini-LED lighting panel 2304 and the third sub-mini-LED lighting panel 2307.

Figure 13:
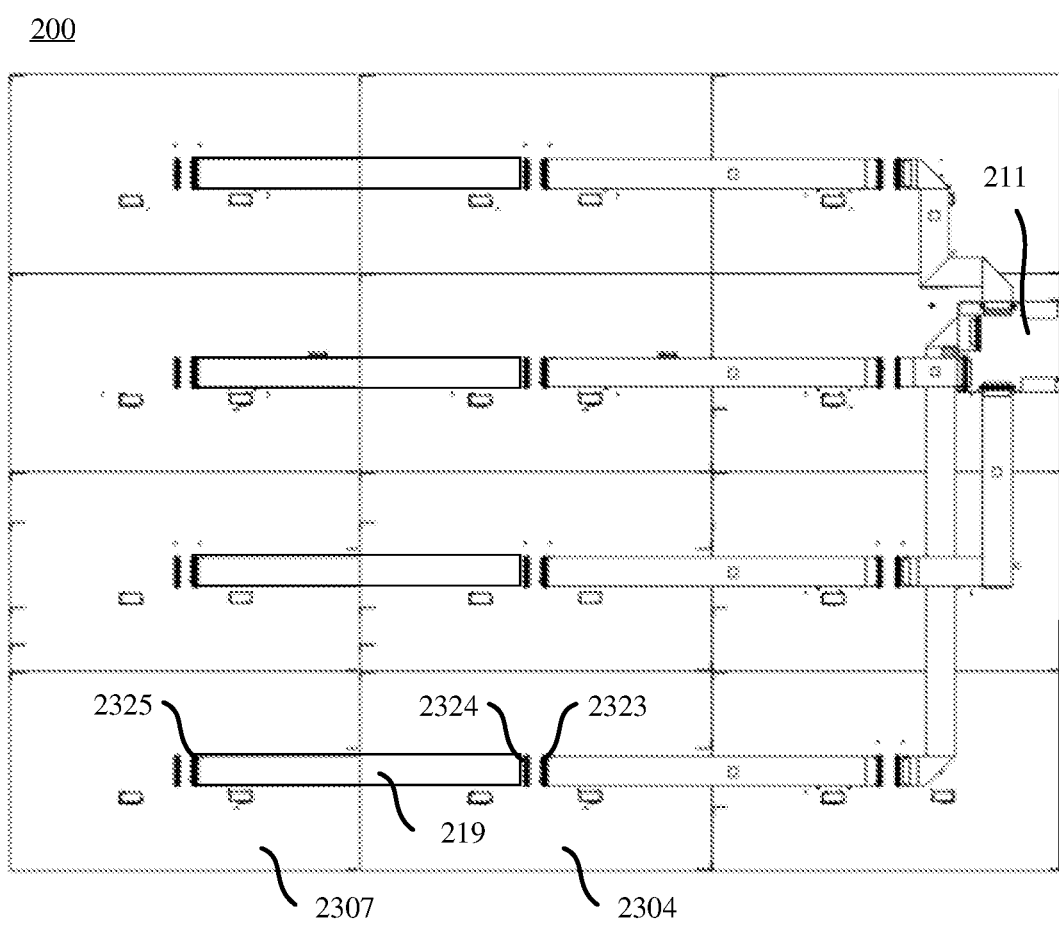
FIG. 13 is a schematic diagram of a structure of a drive circuit of another mini-LED lighting panel according to an embodiment of this application.

In another example, as shown in FIG. 13, the second sub-mini-LED lighting panel 2304 may include a fourth connector 2324. The fourth connector 2324 may be electrically connected to the third connector 2323. The third sub-mini-LED lighting panel 2307 may include a fifth connector 2325. The fourth connector 2324 of the second sub-mini-LED lighting panel 2304 and the fifth connector 2325 of the third sub-mini-LED lighting panel 2307 may be electrically connected through the third electrical connecting member 219. In this case, the second sub-mini-LED lighting panel 2304 may be connected in series to the third sub-mini-LED lighting panel 2307. In other words, a signal from the drive module 211 may be input to the third sub-mini-LED lighting panel 2307 through the second sub-mini-LED lighting panel 2304.

Figure 14:
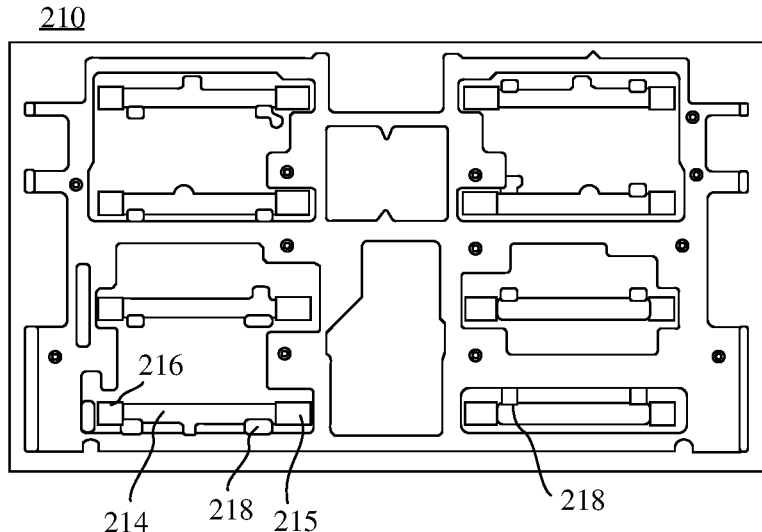
FIG. 14 is a schematic diagram of a structure of a front view of a backplane according to an embodiment of this application.

FIG. 14 is a schematic diagram of a structure of the front view of the backplane 210.

With reference to FIG. 11 and FIG. 14, the backplane 210 may include an electrical connecting member accommodating groove 214. The electrical connecting member accommodating groove 214 may be located between the first backplane through hole 215 and the second backplane through hole 216. The electrical connecting member accommodating groove 214 may be for accommodating the second electrical connecting member 213. A recessing direction of the electrical connecting member accommodating groove 214 may be provided perpendicular to the backplane 210, and the recessing direction may be a direction away from the flat panel 220 and the mini-LED lighting panel 230.

With reference to FIG. 11 and FIG. 14, the backplane 210 may include a drive unit accommodating groove 218, and the drive unit accommodating groove 218 may correspond to the drive unit 233 of the mini-LED lighting panel 2300. The drive unit accommodating groove 218 may be provided corresponding to or aligned to the drive unit 233. A recessing direction of the drive unit accommodating groove 218 may be provided perpendicular to the backplane 210, and the recessing direction may be a direction away from the flat panel 220 and the sub-mini-LED lighting panel 2300.

The drive unit accommodating groove 218 may be for avoiding the drive unit 233 of the mini-LED lighting panel 2300, and reducing a risk of collision between the backplane 210 and the drive unit 233. In addition, a bottom and a side wall of the drive unit accommodating groove 218 may block and cover the drive unit 233. This can mechanically protect the drive unit 233. The drive unit 233 may be relatively sensitive to electromagnetic signal interference. The drive unit accommodating groove 218 may further provide an electromagnetic shielding function for the drive unit 233, to reduce an EMC risk of the drive unit 233.

Figure 15:
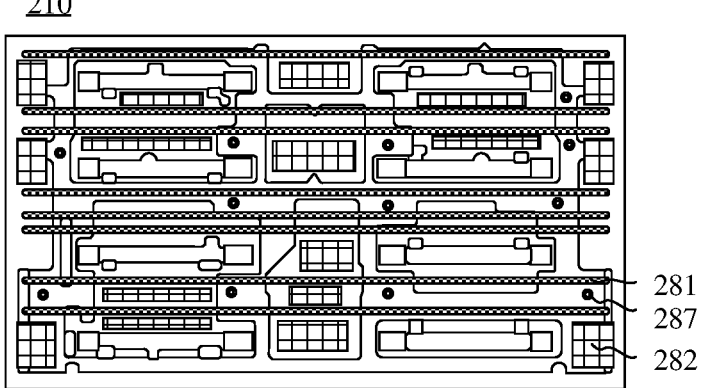
FIG. 15 is a schematic diagram of a structure of a front view of another backplane according to an embodiment of this application.
Figure 16:
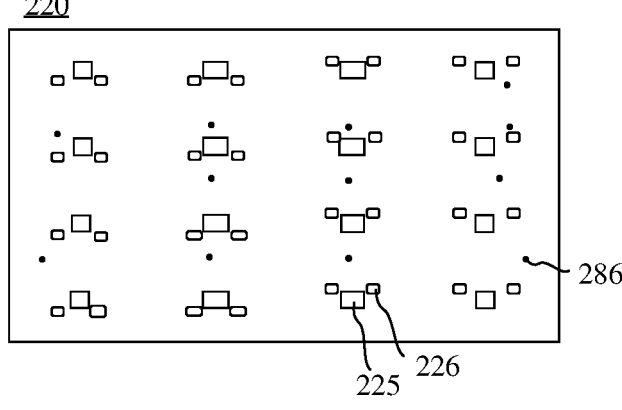
FIG. 16 is a schematic diagram of a structure of a front view of a flat panel according to an embodiment of this application.

One or more mechanical connecting members may be provided on the front view of the backplane 210. FIG. 15 is a schematic diagram of a structure of the backplane 210 provided with a plurality of mechanical connecting members. With reference to FIG. 15 and FIG. 16, the flat panel 220 may be fixed on the front view of the backplane 210 through the mechanical connecting members. The mechanical connecting members may be, for example, any one of the double-faced adhesive 281, the foam 282, and the screw 286.

In FIG. 15, long strip patterns filled with a checkerboard pattern may be schematic diagrams of the double-faced adhesives 281. As shown in FIG. 15, the double-faced adhesives 281 may be pasted on the front view of the backplane 210 at spacings in parallel.

In FIG. 15, rectangular patterns filled with a cross pattern may be schematic diagrams of the foam 282. As shown in FIG. 15, the foam 282 may be pasted on the front view of the backplane 210, and the foam 282 and the double-faced adhesive 281 may be pasted on different regions of the backplane 210. In other words, a pasted region of the foam 282 on the backplane 210 and a pasted region of the foam 282 on the backplane 210 may not overlap. In other words, the foam 282 may be pasted on a region of the backplane 210 without being pasted by the double-faced adhesive 281. If the foam 282 and the double-faced adhesive 281 are pasted in a same region, a thickness of an overlapping region between the foam 282 and the double-faced adhesive 281 may be relatively large, and a thickness of a non-overlapping region between the foam 282 and the double-faced adhesive 281 may be relatively small. This may affect bonding stability between the flat panel 220 and the backplane 210.

The foam 282 may help to absorb deformation. For example, when the backplane 210 is relatively obviously deformed, the flat panel 220 may be relatively slightly deformed under the effect of the foam 282. For another example, when the electronic device 100 works normally, the flat panel 220 may resonate with a sound in the electronic device 100. The foam 282 may absorb a part of the resonance. This can reduce the amplitude of the flat panel 220.

As shown in FIG. 15, the front view of the backplane 210 may include a threaded hole 287. As shown in FIG. 16, a screw 286 matching the threaded hole 287 may be provided on the front view of the flat panel 220. The flat panel 220 may include a flat panel through hole provided corresponding to the threaded hole 287. A screw cap of the screw 286 may be in contact with the front view of the flat panel 220 (that is, the side of the flat panel 220 away from the backplane 210). A rod part of the screw 286 may pass through the flat panel through hole on the flat panel 220, and match with the threaded hole 287 of the backplane 210, thereby fixing the flat panel 220 on the backplane 210. A fixing principle of the screw 286 may be different from a fixing principle of the double-faced adhesive 281 and the foam 282. Using of the screw 286 can improve connection stability between the backplane 210 and the flat panel 220.

Optionally, the backplane 210 may include a backplane protrusion, and the backplane protrusion may protrude toward the flat panel 220. The threaded hole 287 may be provided on the backplane protrusion. At the backplane protrusion, a distance between the backplane 210 and the flat panel 220 may be relatively short. This can reduce a length of the screw 286.

Optionally, the flat panel 220 may include a flat panel boss, and the flat panel boss may protrude toward the backplane 210. The flat panel through hole may be provided on the flat panel boss. At the flat panel boss, a distance between the flat panel 220 and the backplane 210 may be relatively short. This can reduce a length of the screw 286.

When the backplane 210 includes a backplane protrusion, the backplane protrusion and the flat panel protrusion may protrude opposite to each other. Optionally, an end face of the backplane protrusion may be in contact with an end face of the flat panel boss. In this way, the rod part of the screw 286 may be hidden in the threaded hole 287 and the flat panel through hole. In this case, the length of the screw 286 may be effectively reduced. This can protect the screw 286, and further improve connection stability of the screw 286.

As described above, the drive module 211 provided on the rear view of the backplane 210 may be electrically connected to the sub-mini-LED lighting panel 2300. The flat panel 220 may include a first flat panel through hole and a second flat panel through hole. The first flat panel through hole corresponds to the connector 232 of the sub-mini-LED lighting panel 2300. The second flat panel through hole corresponds to the drive unit 233 of the sub-mini-LED lighting panel 2300.

As shown in FIG. 16, the flat panel 220 may include a first flat panel through hole 225 corresponding to the connector 232 of the sub-mini-LED lighting panel 2300. The first flat panel through hole 225 may be provided corresponding to or aligned to the connector 232. The connector 232 may pass through the first flat panel through hole 225. In other words, the connector 232 of the sub-mini-LED lighting panel 2300 may be located on a side of the flat panel 220 away from the sub-mini-LED lighting panel 2300.

As shown in FIG. 16, the flat panel 220 may further include a second flat panel through hole 226 corresponding to the drive unit 233 of the sub-mini-LED lighting panel 2300. The second flat panel through hole 226 may be provided corresponding to or aligned to the drive unit 233. The drive unit 233 may pass through the second flat panel through hole 226. In other words, an end of the drive unit 233 farthest from the sub-mini-LED lighting panel 2300 may be located on a side of the flat panel 220 away from the sub-mini-LED lighting panel 2300.

In another example, when the thickness of the drive module 211 is very small, for example, the thickness of the drive module 211 is less than the thickness of the foam 282, the drive module 211 may be provided on the front view of the flat panel 220. Therefore, the backplane 210 may not include the first backplane through hole 215 and the second backplane through hole 216 shown in FIG. 10 and FIG. 11. In addition, the flat panel 220 may not include the first flat panel through hole 225 and the second flat panel through hole 226 shown in FIG. 16. The drive unit 233 may be located on a side of the flat panel 220 close to the sub-mini-LED lighting panel 2300.

In conclusion, embodiments of this application provide a new electronic device, and the electronic device has a new screen assembly 200. The screen assembly 200 may use a sub-mini-LED lighting panel 2300. The solutions provided in embodiments of this application include a special design of the sub-mini-LED lighting panel 2300, for example, a drive circuit of the sub-mini-LED lighting panel 2300, and a structural design of a light mixing space 241 of the sub-mini-LED lighting panel 2300. The solutions provided in embodiments of this application can enable the electronic device 100 or the screen assembly 200 to have an excellent display effect, EMC performance, and the like. In addition, the solutions provided in embodiments of this application can further improve lightness and thinness of the electronic device 100.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An electronic device, comprising:
   a backplane, a flat panel, a mini-light-emitting diode (mini-LED) lighting panel, a diffusion panel, a first electrical connector and a second electrical connector, and a first driver;
   wherein the flat panel is between the backplane and the mini-LED lighting panel, the mini-LED lighting panel is between the flat panel and the diffusion panel, a light mixing space is between the mini-LED lighting panel and the diffusion panel, and light emitted by the mini-LED lighting panel is incident on the diffusion panel through the light mixing space;
   wherein the first driver comprises a first power port;
   wherein the mini-LED lighting panel comprises a first mini-LED lighting panel group, the first mini-LED lighting panel group comprises a first sub-mini-LED lighting panel and a second sub-mini-LED lighting panel, the first sub-mini-LED lighting panel comprises a first connector and a second connector, the first connector is electrically connected to the first power port through the first electrical connector, the second sub-mini-LED lighting panel comprises a third connector, and the third connector is electrically connected to the second connector through the second electrical connector; and wherein the first sub-mini-LED lighting panel further comprises:

a light emitting circuit group, wherein the light emitting circuit group comprises m first light emitting circuits, and m is an integer greater than or equal to 1; and a second driver, wherein the second driver is electrically connected to the first connector, the second driver comprises a public electrical signal port and a drive port corresponding to the light emitting circuit group, a first end of each first light emitting circuit in the light emitting circuit group is electrically connected to the public electrical signal port, and a second end of each first light emitting circuit in the light emitting circuit group is electrically connected to the drive port.

2. The electronic device of claim 1, wherein the first sub-mini-LED lighting panel or the second sub-mini-LED lighting panel further comprises a fourth connector, and the electronic device further comprises a third electrical connector; and wherein the first mini-LED lighting panel group further comprises a third sub-mini-LED lighting panel, the third sub-mini-LED lighting panel comprises a fifth connector, and the fifth connector is electrically connected to the fourth connector through the third electrical connector.

3. The electronic device of claim 1, further comprising a second mini-LED lighting panel group and a fourth electrical connector; and wherein the first driver further comprises a second power port, and the second mini-LED lighting panel group is electrically connected to the second power port through the fourth electrical connector, and the first power port is a different power port than the second power port.

4. The electronic device of claim 1, wherein the backplane comprises a groove corresponding to the second electrical connector, and the groove is recessed in a direction away from the mini-LED lighting panel, and the second electrical connector is accommodated in the groove.

5. The electronic device of claim 1, wherein the first driver is disposed on a side of the backplane away from the first sub-mini-LED lighting panel, the backplane comprises a first backplane through hole provided corresponding to the first connector, and the first electrical connector or the first connector passes through the first backplane through hole.

6. The electronic device of claim 1, wherein the first driver is located at a side of the flat panel that faces away from the first sub-mini-LED lighting panel, the flat panel comprises a first flat panel through hole provided corresponding to the first connector, and the first connector passes through the first flat panel through hole.

7. The electronic device of claim 1, wherein the flat panel comprises a second flat panel through hole, the second flat panel through hole corresponds to the second driver, and the second driver passes through the second flat panel through hole.

8. The electronic device of claim 1, wherein the backplane comprises a groove corresponding to the second driver, the groove is recessed in a direction away from the first sub-mini-LED lighting panel, and the second driver is accommodated in the groove.

9. The electronic device of claim 1, wherein each first light emitting circuit is disposed on a first lighting panel end face of the first sub-mini-LED lighting panel, the second driver is disposed on a second lighting panel end face of the first sub-mini-LED lighting panel, and the first sub-mini-LED lighting panel further comprises:

a heat conducting block, wherein the heat conducting block is on the second driver; and a shielding can, wherein the second driver is located in a shielding space of the shielding can, and the shielding can is in contact with the heat conducting block.

10. The electronic device of claim 9, wherein the first sub-mini-LED lighting panel further comprises:

a heat conducting film, wherein a part of the heat conducting film is pasted on the shielding can, and another part of the heat conducting film is pasted on the second lighting panel end face.

11. The electronic device of claim 10, wherein the heat conducting film comprises a first part, a second part, and a third part, wherein the first part is pasted on a top surface of the shielding can, the second part is pasted on the second lighting panel end face, the third part is connected between the first part and the second part, and the third part is pasted on a side surface of the shielding can.

12. The electronic device of claim 1, further comprising:

an optically transparent spacer between the mini-LED lighting panel and the diffusion panel, wherein the optically transparent spacer is pasted on a surface of the mini-LED lighting panel.

13. The electronic device of claim 12, wherein the optically transparent spacer has a curved surface, and the curved surface is on a side of the optically transparent spacer that faces the diffusion panel.

14. The electronic device of claim 12, wherein the optically transparent spacer covers a light emitting circuit of the m first light emitting circuits of the mini-LED lighting panel.

15. The electronic device of the claim 1, further comprising:

a diffusion panel support, wherein a side of the diffusion panel support is in contact with the diffusion panel, and a side surface of the diffusion panel support that faces the mini-LED lighting panel is arranged at a spacing with a side surface of the mini-LED lighting panel.

16. The electronic device of claim 15, wherein the diffusion panel support further comprises a support boss, the support boss extends from a body of the diffusion panel support to the mini-LED lighting panel.

17. An electronic device, comprising:

a backplane, a flat panel, a mini-light-emitting diode (mini-LED) lighting panel, a diffusion panel, a first electrical connector and a second electrical connector, and a first driver;

wherein the flat panel is between the backplane and the mini-LED lighting panel, the mini-LED lighting panel is between the flat panel and the diffusion panel, a light mixing space is between the mini-LED lighting panel and the diffusion panel, and light emitted by the mini-LED lighting panel is incident on the diffusion panel through the light mixing space;

wherein the first driver comprises a first power port;

wherein the mini-LED lighting panel comprises a first mini-LED lighting panel group, the first mini-LED lighting panel group comprises a first sub-mini-LED lighting panel and a second sub-mini-LED lighting panel, the first sub-mini-LED lighting panel comprises a first connector and a second connector, the first connector is electrically connected to the first power port through the first electrical connector, the second sub-mini-LED lighting panel comprises a third connector, and the third connector is electrically connected to the second connector through the second electrical connector; and wherein the first sub-mini-LED lighting panel further comprises:

a light emitting circuit group, wherein the light emitting circuit group comprises m first light emitting circuits, and m is an integer greater than or equal to 1; and a second driver, wherein the second driver is electrically connected to the first connector, the second driver comprises a public electrical signal port and a drive port corresponding to the light emitting circuit group, a first end of each first light emitting circuit in the light emitting circuit group is electrically connected to the public electrical signal port, and a second end of each first light emitting circuit in the light emitting circuit group is electrically connected to the drive port;

wherein the first sub-mini-LED lighting panel or the second sub-mini-LED lighting panel further comprises a fourth connector, and the electronic device further comprises a third electrical connector;

wherein the first mini-LED lighting panel group further comprises a third sub-mini-LED lighting panel, the third sub-mini-LED lighting panel comprises a fifth connector, and the fifth connector is electrically connected to the fourth connector through the third electrical connector;

wherein the electronic device further comprises a second mini-LED lighting panel group and a fourth electrical connector; and wherein the first driver further comprises a second power port, and the second mini-LED lighting panel group is electrically connected to the second power port through the fourth electrical connector, and the first power port is a different power port than the second power port.

18. The electronic device according to claim 17, wherein the backplane comprises a groove corresponding to the second electrical connector, the groove is recessed in a direction away from the mini-LED lighting panel, and the second electrical connector is accommodated in the groove.

19. The electronic device according to claim 17, wherein the first driver is disposed on a side of the backplane away from the first sub-mini-LED lighting panel, the backplane comprises a first backplane through hole provided corresponding to the first connector, and the first electrical connector or the first connector passes through the first backplane through hole.

20. The electronic device according to claim 17, wherein the first driver is located at a side of the flat panel that faces away from the first sub-mini-LED lighting panel, the flat panel comprises a first flat panel through hole provided corresponding to the first connector, and the first connector passes through the first flat panel through hole.

* * * * *